United States Patent
Fabbro et al.

(10) Patent No.: US 9,152,163 B1
(45) Date of Patent: Oct. 6, 2015

(54) REGULATION OF A LOAD CURRENT-TO-SENSING CURRENT RATIO IN A CURRENT SENSING POWER METAL-OXIDE-SEMICONDUCTOR FIELD-EFFECT TRANSISTOR (MOSFET)

(71) Applicant: Infineon Technologies Austria AG, Villach (AT)

(72) Inventors: Simone Fabbro, Udine (IT); Emiliano Puia, Villach (AT); Giacomo Cascio, Villach (AT)

(73) Assignee: Infineon Technologies Austria AG, Villach (AU)

( * ) Notice: Subject to any disclaimer, the term of this patent is extended or adjusted under 35 U.S.C. 154(b) by 0 days.

(21) Appl. No.: 14/279,153

(22) Filed: May 15, 2014

(51) Int. Cl.
*G05F 1/10* (2006.01)
*G05F 3/20* (2006.01)

(52) U.S. Cl.
CPC ..................... *G05F 3/205* (2013.01)

(58) Field of Classification Search
CPC . H03K 17/08; H03K 17/082; H03K 17/0822; H03K 2217/0027
See application file for complete search history.

(56) References Cited

U.S. PATENT DOCUMENTS

| 7,952,333 | B2 * | 5/2011 | Heppenstall | 323/269 |
| 8,373,449 | B2 * | 2/2013 | Thiele et al. | 327/103 |
| 8,785,931 | B2 * | 7/2014 | Kinouchi et al. | 257/48 |
| 8,841,897 | B2 * | 9/2014 | Williams et al. | 323/285 |
| 2014/0167797 | A1 * | 6/2014 | Aerts | 324/750.3 |

* cited by examiner

*Primary Examiner* — Jeffrey Zweizig
(74) *Attorney, Agent, or Firm* — Shumaker & Sieffert, P.A.

(57) ABSTRACT

This disclosure describes techniques for regulating a $k_{ILIS}$ factor (i.e., a load current-to-sensing current ratio) of a current sensing power metal-oxide-semiconductor field-effect transistor (MOSFET). The techniques may include generating a reference voltage based on a configurable function that defines the reference voltage as a function of two or more main terminal voltages which are obtained at two or more different locations on a metallization that forms a main terminal of a current sensing power MOSFET, and regulating a sensing terminal of the current sensing power MOSFET at a voltage that is determined based on the reference voltage. Using a configurable function of two or more main terminal voltages to regulate a sensing terminal of a current sensing power MOSFET may allow the voltage at which the sensing terminal is regulated to be trimmed in order to improve the accuracy of the $k_{ILIS}$ factor produced by the current sensing power MOSFET.

20 Claims, 11 Drawing Sheets

_
REGULATION OF A LOAD CURRENT-TO-SENSING CURRENT RATIO IN A CURRENT SENSING POWER METAL-OXIDE-SEMICONDUCTOR FIELD-EFFECT TRANSISTOR (MOSFET)

TECHNICAL FIELD

This disclosure relates to power transistors, and more particularly to current sensing power transistors.

BACKGROUND

A power metal-oxide-semiconductor field-effect transistor (MOSFET) may be used to implement a voltage-controlled semiconductor switch that can handle relatively significant levels of power without breaking down. One type of power MOSFET is a current sensing power MOSFET. A current sensing power MOSFET may be used to implement a voltage-controlled semiconductor switch and to measure a load current that is flowing through the power semiconductor switch in a relatively efficient manner without requiring the use of separate current sensing resistors.

A current sensing power MOSFET may split a load current flowing through the current sensing power MOSFET into a main current that flows through a main current path and a sensing current that flows through a sensing current path. The ratio of the amplitude of the load current to the amplitude of the sensing current may be referred to as the $k_{ILIS}$ factor of the current sensing power MOSFET (alternatively referred to as the "load current-to-sensing current ratio" of the current sensing power MOSFET).

If the $k_{ILIS}$ factor of a particular current sensing power MOSFET is known, then measurement of the sensing current may be used along with the $k_{ILIS}$ factor to determine the amount of load current flowing through the switch. Thus, the degree of accuracy of a load current measurement is dependent upon the degree of accuracy to which a current sensing power MOSFET actually produces a specified $k_{ILIS}$ factor. Causing a current sensing power MOSFET to produce a specific $k_{ILIS}$ factor with a relatively high degree of accuracy can present significant challenges.

SUMMARY

This disclosure describes techniques for regulating a $k_{ILIS}$ factor (i.e., a load current-to-sensing current ratio) of a current sensing power metal-oxide-semiconductor field-effect transistor (MOSFET). The techniques for regulating the $k_{ILIS}$ factor may generate a reference voltage based on a configurable function that defines the reference voltage as a function of two or more main terminal voltages, and may regulate a sensing terminal of the current sensing power MOSFET at a voltage that is determined based on the reference voltage. The two or more main terminal voltages may be obtained at two or more different locations on a metallization that forms a main terminal of the current sensing power MOSFET. Using a configurable function of two or more main terminal voltages to regulate a sensing terminal of a current sensing power MOSFET may allow the voltage at which the sensing terminal is regulated to be trimmed such that a $k_{ILIS}$ factor actually produced by the power MOSFET is approximately equal to a target $k_{ILIS}$ factor for the power MOSFET, even in cases where the voltage distribution across the main terminal of the power MOSFET is not completely uniform. In this way, a current sensing power MOSFET may be controlled to produce a $k_{ILIS}$ factor with a relatively high degree of accuracy.

In one example, this disclosure describes a method that includes generating a reference voltage based on a configurable function that defines the reference voltage as a function of two or more main terminal voltages that are obtained at two or more different locations on a metallization that forms a main terminal of a current sensing power MOSFET. The method further includes regulating a sensing terminal of the current sensing power MOSFET at a voltage that is determined based on the reference voltage.

In another example, this disclosure describes a device that includes circuitry configured to generate a reference voltage based on a configurable function that defines the reference voltage as a function of two or more main terminal voltages that are obtained at two or more different locations on a metallization that forms a main terminal of a current sensing power MOSFET. The circuitry is further configured to regulate a sensing terminal of the current sensing power MOSFET at a voltage that is determined based on the reference voltage In another example, this disclosure describes an apparatus that includes means for generating a reference voltage based on a configurable function that defines the reference voltage as a function of two or more main terminal voltages that are obtained at two or more different locations on a metallization that forms a main terminal of a current sensing power MOSFET. The apparatus further includes means for regulating a sensing terminal of the current sensing power MOSFET at a voltage that is determined based on the reference voltage.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
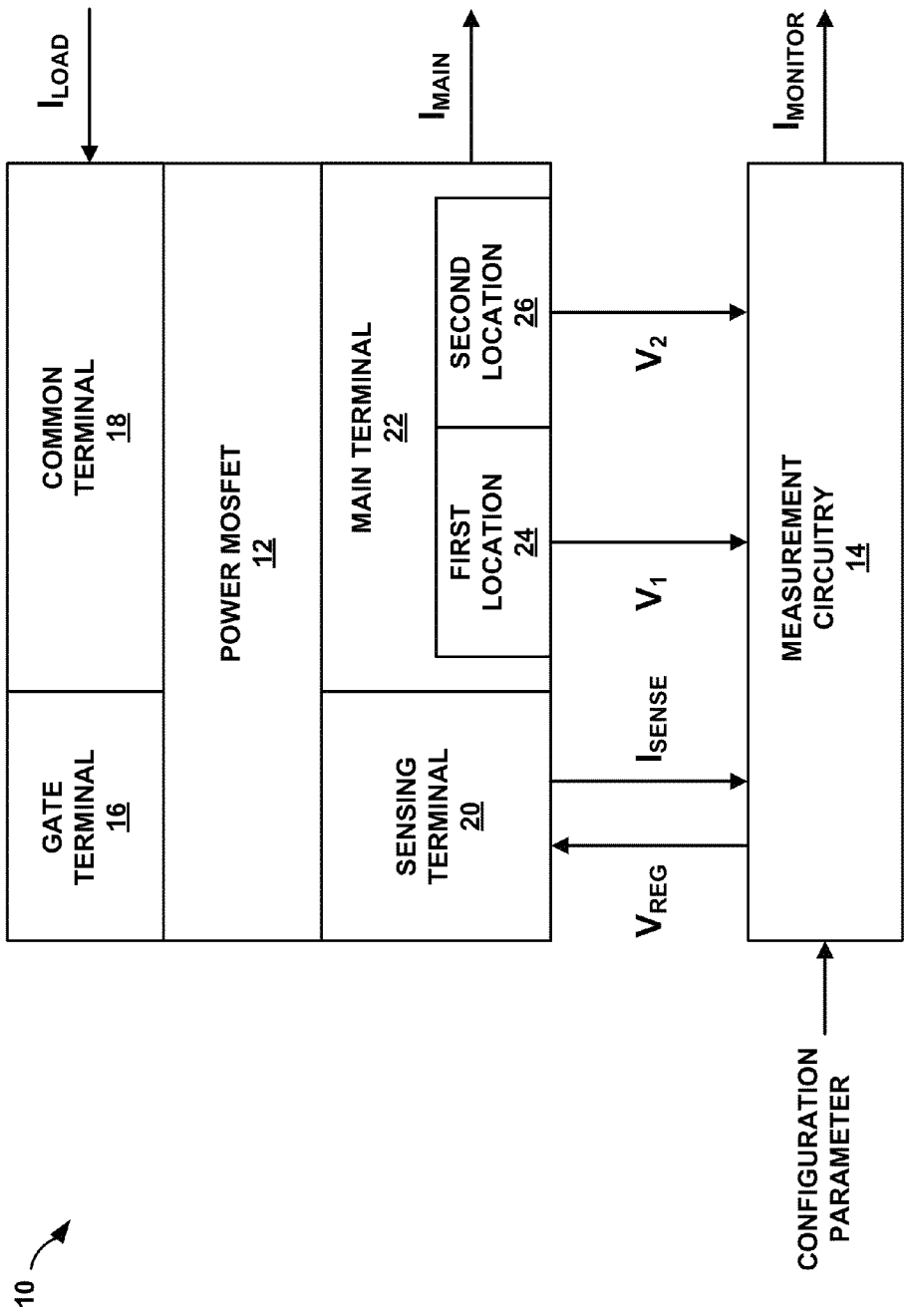
FIG. 1 is a conceptual diagram illustrating an example system that may be used to perform the $k_{ILIS}$ factor (i.e., load current-to-sensing current ratio) regulation techniques of this disclosure.

This disclosure describes techniques for regulating a $k_{ILIS}$ factor (i.e., a load current-to-sensing current ratio) of a current sensing power metal-oxide-semiconductor field-effect transistor (MOSFET). The techniques for regulating the $k_{ILIS}$ factor may generate a reference voltage based on a configurable function that defines the reference voltage as a function of two or more main terminal voltages, and may regulate a sensing terminal of the current sensing power MOSFET at a voltage that is determined based on the reference voltage. The two or more main terminal voltages may be obtained at two or more different locations on a metallization that forms a main terminal of the current sensing power MOSFET. Using a configurable function of two or more main terminal voltages to regulate a sensing terminal of a current sensing power MOSFET may allow the voltage at which the sensing terminal is regulated to be trimmed such that the $k_{ILIS}$ factor actually produced by the power MOSFET is approximately equal to a target $k_{ILIS}$ factor for the power MOSFET, even in cases where the voltage distribution across the main terminal of the power MOSFET is not completely uniform. In this way, a current sensing power MOSFET may be controlled to produce a $k_{ILIS}$ factor with a relatively high degree of accuracy.

A current sensing power MOSFET may split a load current flowing through the current sensing power MOSFET into a main current that flows through a main current path and a sensing current that flows through a sensing current path. One end of the main current path and one end of the sensing current path may be electrically coupled to each other, and the other ends of the main current path and the sensing current path may be electrically isolated from each other. The ends of the main current path and the sensing current path that are electrically coupled to each other may form a common terminal for the current sensing power MOSFET. The end of the main current path that is opposite the common terminal may form a main terminal for the current sensing power MOSFET, and the end of the sensing current path that is opposite the common terminal may form a sensing terminal for the current sensing power MOSFET.

Both the main current path and the sensing current path may be formed by respective transistors (e.g., MOSFETs) that have different effective transistor width-to-length ratios, but are otherwise matched. The transistor that forms the main current path may be referred to as the main current path transistor, and the transistor that forms the sensing current path may be referred to as the sensing current path transistor. In some cases, one or both of the main current path transistor and the sensing current path transistor may include a plurality of transistor cells. The transistor sizing ratio of a current sensing power MOSFET may refer to a ratio of the sizing (e.g., width-to-length ratio) of the main current path transistor to the sizing (e.g., width-to-length ratio) of the sensing current path transistor.

The target $k_{ILIS}$ factor for a current sensing power MOSFET may be a design parameter that specifies the ratio of load current to sensing current that is ideally provided by a current sensing power MOSFET. The actual $k_{ILIS}$ factor for a current sensing power MOSFET may refer to the ratio of load current to sensing current that is actually provided by a current sensing power MOSFET when conducting current.

The accuracy of the actual $k_{ILIS}$ factor provided by a current sensing power MOSFET may refer to how close the actual $k_{ILIS}$ factor is to the target $k_{ILIS}$ factor for the current sensing power MOSFET. Oftentimes, a current sensing power MOSFET is designed such that the transistor sizing ratio of the current sensing power MOSFET is equal to or approximately equal to the target $k_{ILIS}$ factor for the current sensing power MOSFET. In such cases, the accuracy of the actual $k_{ILIS}$ factor achieved by a current sensing power MOSFET may be dependent on how well the voltages across the main current path transistor and the sensing current path transistor match. Because the current path transistors share a common endpoint, matching the voltages across the current path transistors may be achieved by matching the voltages at the non-common endpoints of the current path transistors.

One solution to match the voltages at the non-common endpoints of the current path transistors is to regulate the sensing terminal of the current sensing power MOSFET at the same voltage as the main terminal of the current sensing power MOSFET. However, because the metallization included on the main terminal of the current sensing power MOSFET may be relatively large, the voltage across the metallization of the main terminal may not be uniformly distributed. In other words, different locations on the metallization of the main terminal may operate at different voltages, even during steady-state operating conditions. Because the voltage across the main terminal may not be uniform, a voltage at any particular location along the main terminal may not be representative of the aggregate voltage of the entire main terminal. Regulating the sensing terminal at a voltage that is not representative of the aggregate voltage of the entire main terminal may introduce errors into the $k_{ILIS}$ factor produced by the power MOSFET.

Determining the voltage that best represents the aggregate voltage of the main terminal may be a difficult task. In some examples, multiple voltages may be sensed on the main terminal of the power MOSFET at different locations, and a regulation voltage may be determined based on the multiple voltages that are sensed on the main terminal. However, due to manufacturing process variations and other factors, it is often difficult to determine in advance of manufacture how to best combine the multiple voltages that are sensed at different locations to produce the best regulation voltage.

According to this disclosure, circuitry that implements a configurable function may be used to determine a reference voltage that is used for regulating the sensing terminal of a current sensing power MOSFET. The configurable function may define the reference voltage as a function of the two or more main terminal voltages. Using a configurable function of two or more main terminal voltages to regulate a sensing terminal of a current sensing power MOSFET may allow the voltage at which the sensing terminal is regulated to be trimmed such that a $k_{ILIS}$ factor actually produced by the power MOSFET is approximately equal to a target $k_{ILIS}$ factor for the power MOSFET, even in cases where the voltage distribution across the main terminal of the power MOSFET is not completely uniform. In this way, a current sensing power MOSFET may be controlled to produce a $k_{ILIS}$ factor with a relatively high degree of accuracy.

In some cases, even if the sensing terminal of a current sensing power MOSFET is regulated at the aggregate voltage of the entire main terminal, the construction of the sensing power MOSFET may still cause the device to produce a $k_{ILIS}$ factor that is slightly offset from the target $k_{ILIS}$ factor. For example, some current sensing power MOSFETs may be built such that the voltage taps that are taken from the main terminal are Kelvin connections, but the connection that is used to regulate the voltage at the sensing terminal is not a Kelvin connection. Because a Kelvin connection is not used to regulate the sensing terminal, a voltage drop may occur across the wiring and interconnect resistances of the sensing terminal, which may cause the voltage at the source or drain of the sensing current path transistor to be slightly offset from the voltage at which the sensing terminal is regulated. This voltage offset may cause an error in the actual $k_{ILIS}$ factor produced by the current sensing power MOSFET, even in cases where the sensing terminal is regulated at the aggregate voltage of the entire main terminal.

As discussed above, the techniques of this disclosure may use a configurable function to define a reference voltage that is used for regulating the sensing terminal of a current sensing power MOSFET. The configurable function may allow the reference voltage used for regulating the sensing terminal of the current sensing power MOSFET to be trimmed during or after manufacture of the current sensing power MOSFET to compensate for the voltage drop that may occur due to the wiring and interconnect resistance of the sensing terminal. In this way, an accurate $k_{ILIS}$ factor may be achieved even in cases where a voltage drop occurs across the wiring and interconnect resistances of the sensing terminal.

In some examples, circuitry that implements a configurable voltage divider may be used to implement the configurable function that defines the reference voltage. For example, a potentiometer may be used to implement the configurable voltage divider. A configurable voltage divider may allow any voltage between the two main terminal voltage taps to be selected as the regulated voltage. The aggregate voltage across the main terminal may be a voltage that is between the highest and lowest voltages on the metallization of the main terminal. Therefore, if voltage taps are located at locations on the metallization of the main terminal where approximately the highest and lowest voltages are found, then the aggregate voltage across the main terminal may be between the voltages sensed at the main terminal voltages taps. If the aggregate voltage across the main terminal is between the voltages sensed at the main terminal voltages taps, then a configurable voltage divider may be configured to generate the appropriate reference voltage for achieving the target $k_{ILIS}$ factor. Using a configurable voltage divider (e.g., a potentiometer) allows a configurable function that is relatively easy-to-adjust to be implemented with relatively few circuit components.

FIG. 1 is a conceptual diagram illustrating an example system 10 that may be used to perform the $k_{ILIS}$ factor regulation techniques of this disclosure. System 10 includes a current sensing power MOSFET 12 and measurement circuitry 14.

Power MOSFET 12 may be configured to act as a power switch and further configured to split a load current into a main current and a sensing current when conducting current. The sensing current may be used for measuring a load current that flows through power MOSFET 12. Power MOSFET 12 includes a gate terminal 16, a common terminal 18, a sensing terminal 20, and a main terminal 22. Main terminal 22 may include a metallization that includes a first location 24 and a second location 26.

Power MOSFET 12 may include a main current path that is formed between common terminal 18 and main terminal 22. Power MOSFET 12 may further include a sensing current path that is formed between common terminal 18 and sensing terminal 20. One end of the main current path and one end of the sensing current path may be electrically coupled to each other, and the other ends of the main current path and the sensing current path may be electrically isolated from each other. The ends of the main current path and the sensing current path that are electrically coupled to each other may correspond to common terminal 18, the end of the main current path that is opposite common terminal 18 may correspond to main terminal 22, and the end of the sensing current path that is opposite common terminal 18 may correspond to sensing terminal 20.

In some examples, common terminal 18 may correspond to the drain of power MOSFET 12. In such examples, main terminal 22 may correspond to a main source terminal, and sensing terminal 20 may correspond to a sensing source terminal. In further examples, common terminal 18 may correspond to the source of power MOSFET 12. In such examples, main terminal 22 may correspond to a main drain terminal, and sensing terminal 20 may correspond to a sensing drain terminal.

To implement power switching functionality, power MOSFET 12 may be configurable to operate in an on state and an off state. When operating in the on state, power MOSFET 12 may allow a current to flow through the main current path and the sensing current path of power MOSFET 12. In other words, when operating in the on state, power MOSFET 12 may allow a current to flow between common terminal 18 and main terminal 22 of power MOSFET 12, and may allow a current to flow between common terminal 18 and sensing terminal 20 of power MOSFET 12.

When operating in the off state, power MOSFET 12 may not allow a current to flow through the main current path and the sensing current path of power MOSFET 12. In other words, when operating in the off state, power MOSFET 12 may not allow a current to flow between common terminal 18 and main terminal 22 of power MOSFET 12, and may not allow a current to flow between common terminal 18 and sensing terminal 20 of power MOSFET 12.

Gate terminal 16 may control power MOSFET 12 to switch power MOSFET 12 between the on state and the off state. In some cases, gate terminal 16 may control power MOSFET 12 based on a gate-source voltage. The gate-source voltage may be a voltage that is defined between gate terminal 16 and a source terminal of power MOSFET 12 (e.g., common terminal 18 or sensing terminal 20/main terminal 22). If the gate-source voltage is greater than a threshold, then power MOSFET 12 may operate in the on state. On the other hand, if the gate-source voltage is not greater than the threshold, then power MOSFET 12 may operate in the off state.

The current that flows through the main current path may be referred to as the main current (i.e., $I_{MAIN}$), and the current that flows through the sensing current path may be referred to as the sensing current (i.e., $I_{SENSE}$). The load current (i.e., $I_{LOAD}$) may be equal to the sum of the main current and the sensing current. As shown in FIG. 1, the load current may flow into common terminal 18, the sensing current may flow out of sensing terminal 20, and the main current may flow out of main terminal 22.

The $k_{ILIS}$ factor for power MOSFET 12 may be a design parameter that specifies the ratio of load current to sensing current that is ideally provided by power MOSFET 12. In other words, the $k_{ILIS}$ factor may be defined as follows:

$$k_{ILIS} = \frac{I_{LOAD}}{I_{SENSE}} \quad (1)$$

where $I_{LOAD}$ corresponds to the load current and $I_{SENSE}$ corresponds to the sensing current.

In equation (1), the load current ($I_{LOAD}$) may be equal to the sum of the main current and the sensing current (i.e., $I_{LOAD}=I_{MAIN}+I_{SENSE}$). Because $I_{SENSE}$ is typically much smaller than $I_{MAIN}$ (due to the relatively large scaling factor between the sizing of the main current path transistor and the sensing current path transistor), the load current may be rewritten as follows:

$$I_{LOAD} = I_{MAIN} + I_{SENSE} \cong I_{MAIN} \quad (2)$$

This allows equation (1) to be rewritten as follows:

$$k_{ILIS} = \frac{I_{MAIN} + I_{SENSE}}{I_{SENSE}} \cong \frac{I_{MAIN}}{I_{SENSE}} \quad (3)$$

where $I_{MAIN}$ corresponds to the main current, and $I_{SENSE}$ corresponds to the sensing current. In other words, the $k_{ILIS}$ factor of power MOSFET 12 may be approximately equal to the ratio of the main current to the sensing current of power MOSFET 12.

The target $k_{ILIS}$ factor for power MOSFET 12 may be a design parameter that specifies the ratio of load current to sensing current that is ideally provided by power MOSFET 12. The actual $k_{ILIS}$ factor for power MOSFET 12 may refer to the ratio of load current to sensing current that is actually provided by power MOSFET 12 while power MOSFET 12 is operating in the on state. The actual $k_{ILIS}$ factor for power MOSFET 12 may be alternatively referred to as the $k_{ILIS}$ factor without using the actual qualifier. For both the actual $k_{ILIS}$ factor and the target $k_{ILIS}$ factor, the ratio of the load current to the sensing current may be a ratio of the amplitude of the load current to the amplitude of the sensing current. The actual $k_{ILIS}$ factor produced by power MOSFET 12 may be dependent on the relationship of the voltages between sensing terminal 20 and main terminal 22 of power MOSFET 12.

Measurement circuitry 14 may regulate the voltage at sensing terminal 20 based on two or more voltages sensed at main terminal 22 of power MOSFET 12. In some examples, measurement circuitry 14 may regulate the voltage at sensing terminal 20 such that the actual $k_{ILIS}$ factor produced by power MOSFET 12 conforms to a target $k_{ILIS}$ factor specified for power MOSFET 12.

Measurement circuitry 14 may be electrically coupled to sensing terminal 20 of power MOSFET 12, and electrically coupled to two different locations of main terminal 22 of power MOSFET 12. For example, as shown in FIG. 1, measurement circuitry 14 is electrically coupled to first location 24 and second location 26 of main terminal 22 of power MOSFET 12.

According to this disclosure, measurement circuitry 14 may implement a configurable function that defines a reference voltage as a function of two or more main terminal voltages (e.g., $V_1$ and $V_2$) that are obtained at two or more different locations (e.g., locations 24 and 26) on a metallization that forms main terminal 22 of power MOSFET 12. Measurement circuitry 14 may generate a reference voltage based on the configurable function, and regulate sensing terminal 20 of power MOSFET 12 at a regulation voltage that is determined based on the reference voltage.

Using a configurable function of two or more main terminal voltages to regulate a sensing terminal of power MOSFET 12 may allow the regulation voltage to be trimmed such that a $k_{ILIS}$ factor actually produced by power MOSFET 12 is approximately equal to a target $k_{ILIS}$ factor for power MOSFET 12, even in cases where the voltage distribution across main terminal 22 of power MOSFET 12 is not completely uniform and even in cases where a voltage drop occurs across the wiring and interconnect resistances of sensing terminal 20. In this way, power MOSFET 12 may be controlled to produce a $k_{ILIS}$ factor with a relatively high degree of accuracy.

As discussed above, power MOSFET 12 may include a main current path and a sensing current path. Each of the main current path and the sensing current path may be formed by a transistor (e.g., a MOSFET transistor). The transistor that is used to form the main current path may be referred to as the main current path transistor, and the transistor that is used to form the sensing current path may be referred to as the sensing current path transistor.

One or both of the main current path transistor and the sensing current path transistor may, in some examples, include multiple transistor cells that are electrically coupled to each other in parallel. Transistor cells that are electrically coupled to each other in parallel may refer to transistor cells where the sources of each of the cells are electrically coupled to each other, then drains of each of the cells are electrically coupled to each other, and the gates of each of the cells are electrically coupled to each other. In further examples, one or both of the main current path transistor and the sensing current path transistor may each be formed by a single transistor cell.

In some examples, the transistors that form the main current path and the sensing current path may be arranged in either a common drain configuration or a common source configuration. In examples where the transistors that form the main current path and the sensing current path are arranged in a common drain configuration, the drain terminals of the transistors that form the main current path and the sensing current path may correspond to common terminal 18 of power MOSFET 12, and the gate terminals of the transistors that form the main current path and the sensing current path may correspond to gate terminal 16 of power MOSFET 12. In such examples, the source terminals of the transistors that form the main current path may correspond to main terminal 22 of power MOSFET 12, and the source terminals of the transistors that form the sensing current path may correspond to sensing terminal 20 of power MOSFET 12.

In examples where the transistors that form the main current path and the sensing current path are arranged in a common source configuration, the source terminals of the transistors that form the main current path and the sensing current path may correspond to common terminal 18 of power MOSFET 12, and the gate terminals of the transistors that form the main current path and the sensing current path may correspond to gate terminal 16 of power MOSFET 12. In such examples, the drain terminals of the transistors that form the main current path may correspond to main terminal 22 of power MOSFET 12, and the drain terminals of the transistors that form the sensing current path may correspond to sensing terminal 20 of power MOSFET 12.

The transistors that form the main current path and the sensing current path may be n-channel or p-channel transistors depending on the type of power MOSFET 12 being implemented. For example, if an n-channel power MOSFET 12 is being implemented, then all of the transistors that form the main current path and the sensing current path may be n-channel transistors. Similarly, if a p-channel power MOSFET 12 is being implemented, then all of the transistors that form the main current path and the sensing current path may be p-channel transistors.

As discussed above, power MOSFET 12 may include a main current path transistor and a sensing current path transistor. Similar to power MOSFET 12 itself, the main current path transistor and the sensing current path transistor may each operate in an on state and an off state. When power MOSFET 12 operates in the on state, then the main current path transistor and the sensing current path transistor may also operate in the on state. Similarly, when power MOSFET 12 operates in the off state, then the main current path transistor and the sensing current path transistor may also operate in the off state.

When a current path transistor operates in the on state, the current path transistor may allow current to flow between the source and drain of the transistor. Similarly, when a current path transistor operates in the off state, the current path transistor may not allow current to flow between the source and drain of the transistor. If the current path transistor includes a plurality of transistor cells, each of the transistor cells may operate in an on state or off state that corresponds to the state of the effective current path transistor that corresponds to the plurality of transistor cells.

If a current path transistor (i.e., a main current path transistor or a sensing current path transistor) includes multiple transistor cells, then the transistor sizing (e.g., width-to-length ratio) of the current path transistor may correspond to the transistor sizing (e.g., width-to-length ratio) of the effective transistor formed by the multiple transistor cells. For example, if a current path transistor is formed by a plurality of transistor cells that are electrically coupled to each other in parallel, then the width-to-length ratio of the effective transistor formed by the plurality of transistor cells may be equal to the sum of the widths of the individual transistor cells divided by the length of one of the transistor cells. If a current path transistor includes a single transistor cell, then the transistor sizing (e.g., width-to-length ratio) of the current path transistor may be equal, in some examples, to the transistor sizing (e.g., width-to-length ratio) of the single transistor cell. In either case, the sizing (e.g., width-to-length ratio) of the current path transistor may refer to the sizing (e.g., width-to-length ratio) of the effective transistor formed by the one or more transistor cells which are included in the current path transistor. In some cases, the width-to-length ratio of the effective transistor formed by the one or more transistor cells which are included in the current path transistor may be alternatively referred to as the effective width-to-length ratio of the current path transistor.

To achieve a particular target $k_{ILIS}$ factor, power MOSFET 12 may, in some examples, be designed such that the main current path transistor and the sensing current path transistor have different transistor width-to-length ratios. The transistor sizing ratio of power MOSFET 12 may refer to the ratio of the width-to-length ratio of the main current path transistor to the width-to-length ratio of the sensing current path transistor.

In some examples, power MOSFET 12 may be designed such that the transistor sizing ratio is equal to the target $k_{ILIS}$ factor of power MOSFET 12. For example, if a target $k_{ILIS}$ factor of N:1 is desired, then power MOSFET 12 may be designed to have a transistor sizing ratio of N:1, where N may correspond to an integer greater than or equal to two.

When power MOSFET 12 is operating in the on state, each of the main current path transistor and the sensing current path transistor may have a respective on-resistance. The on-resistance for a current path transistor may refer to a resistance that occurs between the source and drain of the current path transistor when the transistor is turned on. The ratio of on-resistances for the current path transistors may refer to the ratio of the on-resistance of the main current path transistor to the on-resistance of the sensing current path transistor. In general, as the width-to-length ratio of a transistor increases, the on-resistance of the transistor decreases. Therefore, a wider current path transistor may have a lower on-resistance than a narrower current path transistor that has the same length as the wider current path transistor.

The difference in transistor width-to-length ratios between the main current path transistor and the sensing current path transistor causes the main current path transistor and the sensing current path transistor to have different on-resistances, which may further cause different amounts of current to flow through the main current path and the sensing current path when power MOSFET 12 is operating in the on state. The ratio of the different amounts of current flowing through the main current path and the sensing current path may be approximately equal to the actual $k_{ILIS}$ factor produced by power MOSFET 12.

Figure 2:
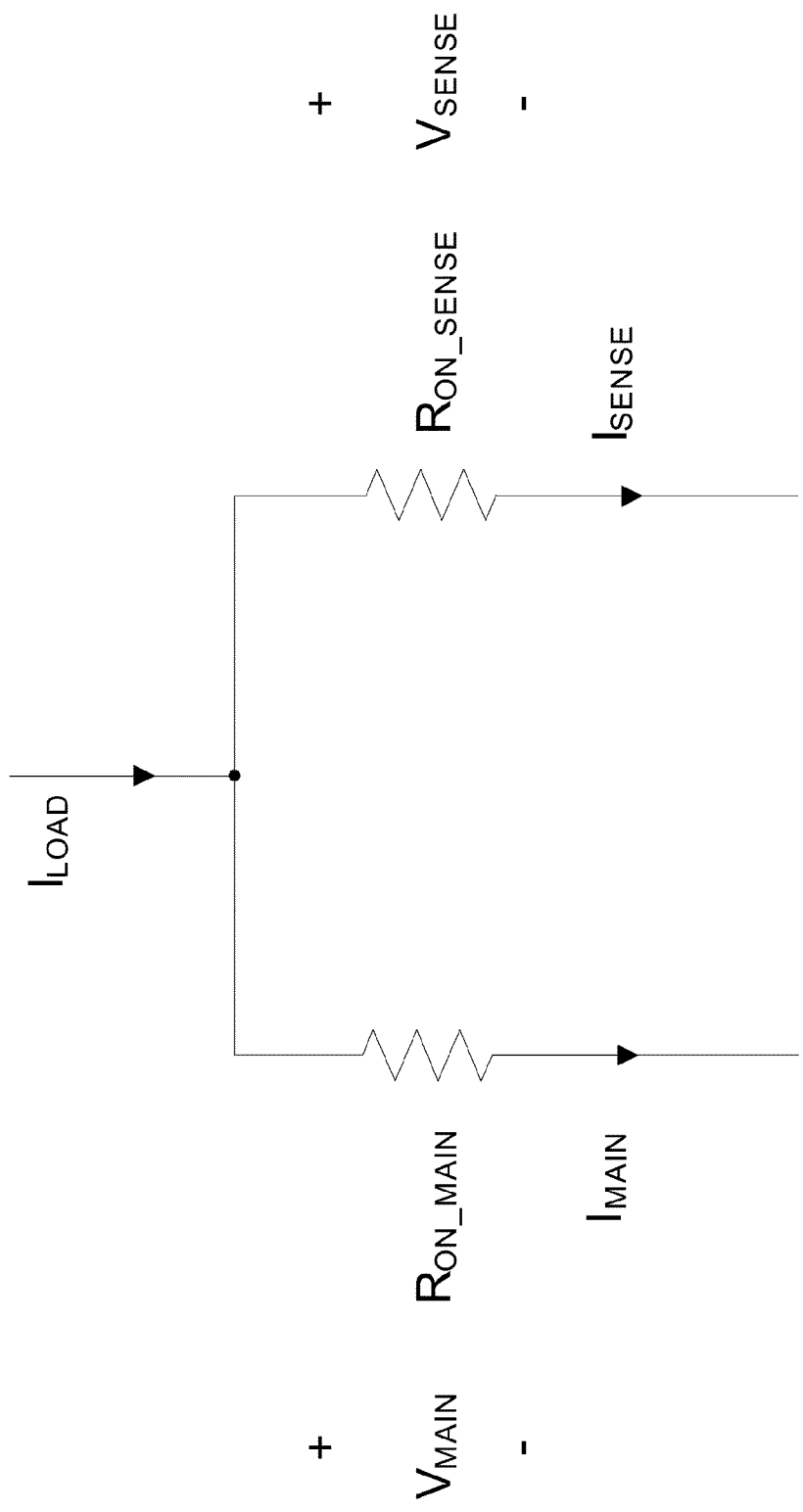
FIG. 2 is a conceptual diagram illustrating a model of a power metal-oxide-semiconductor field-effect transistor (MOSFET) when operating in the on state.

FIG. 2 is a conceptual diagram illustrating a model of power MOSFET 12 when operating in the on state. In FIG. 2, $R_{ON\_MAIN}$ represents the main current path transistor, and in particular, the on resistance of the main current path transistor. Similarly, $R_{ON\_SENSE}$ represents the sensing current path transistor, and in particular, the on resistance of the sensing current path transistor. The on-resistance for a current path transistor may refer to a resistance that occurs between the source and drain of the current path transistor when the transistor is turned on.

$V_{MAIN}$ represents the voltage across the main current path transistor, and $V_{SENSE}$ represents the voltage across the sensing current path transistor. The voltage across a current path transistor may refer to the voltage that occurs between the source and the drain of the current path transistor when the transistor is turned on.

Based on the model shown in FIG. 2, the sensing current ($I_{SENSE}$) and the main current ($I_{MAIN}$) can be written as:

$$I_{SENSE} = \frac{V_{SENSE}}{R_{ON\_SENSE}} \quad (4)$$

$$I_{MAIN} = \frac{V_{MAIN}}{R_{ON\_MAIN}} \quad (5)$$

where $V_{SENSE}$ corresponds to the voltage across the sensing current path transistor, $V_{MAIN}$ corresponds to the voltage across the main current path transistor, $R_{ON\_SENSE}$ corresponds to the on resistance of the sensing current path transistor, and $R_{ON\_MAIN}$ corresponds to the on resistance of the main current path transistor.

Because $R_{ON\_SENSE} \gg R_{ON\_MAIN}$, the actual $k_{ILIS}$ factor for power MOSFET 12 can be written as:

$$k_{ILIS} = \frac{I_{LOAD}}{I_{SENSE}} \cong \frac{R_{ON\_SENSE}}{R_{ON\_MAIN}} \cdot \frac{V_{MAIN}}{V_{SENSE}} \quad (6)$$

As shown in equation (6), the actual $k_{ILIS}$ factor produced by power MOSFET 12 may be dependent on the on-resistances of each of the current path transistors and the voltage across each of the current path transistors.

Figure 3:
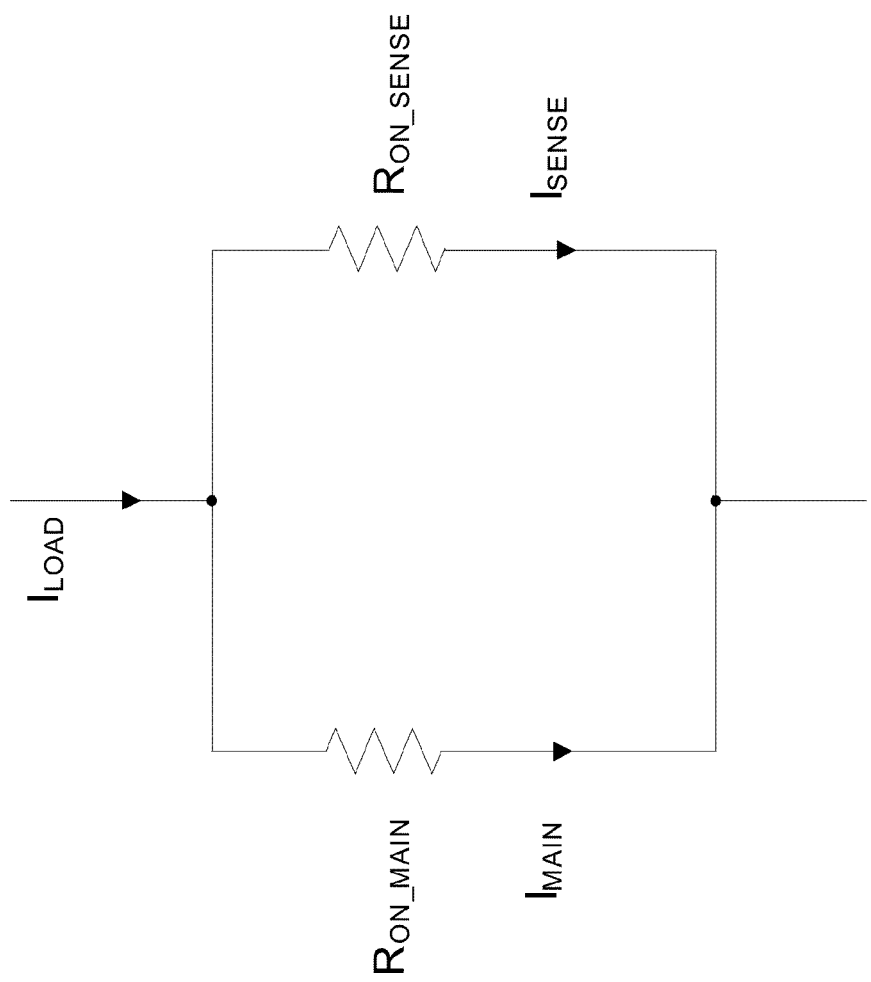
FIG. 3 is a conceptual diagram illustrating a model of a power MOSFET when operating in the on state where the potentials at corresponding end terminals of the main current path transistor and the sensing current path transistor are the same.

FIG. 3 is a conceptual diagram illustrating a model of power MOSFET 12 when operating in the on state where the potentials at corresponding end terminals of the main current path transistor and the sensing current path transistor are the same. In other words, FIG. 3 illustrates a case where the potential at the source terminals of the main current path transistor and the sensing current path transistor are the same, and the potentials at the drain terminals of the main current path transistor and the sensing current path transistor are the same.

Because the potentials at corresponding end terminals of the main current path transistor and the sensing current path transistor are the same, the main current path transistor and the sensing current path transistor are modeled as two resistances that are electrically coupled in parallel. Based on the model shown in FIG. 3, the sensing current ($I_{SENSE}$) can be written as:

$$I_{SENSE} = \frac{R_{ON\_MAIN}}{R_{ON\_MAIN} + R_{ON\_SENSE}} \cdot I_{LOAD} \quad (7)$$

where $I_{LOAD}$ corresponds to the load current, $R_{ON\_MAIN}$ corresponds to the on resistance of the main current path transistor, and $R_{ON\_SENSE}$ corresponds to the on resistance of the sensing current path transistor.

Because $R_{ON\_SENSE} \gg R_{ON\_MAIN}$, the actual $k_{ILIS}$ factor for power MOSFET 12 when the potentials at corresponding end terminals of the main current path transistor and the sensing current path transistor are the same can be written as:

$$k_{ILIS} = \frac{I_{LOAD}}{I_{SENSE}} \cong \frac{R_{ON\_SENSE}}{R_{ON\_MAIN}} \quad (8)$$

As shown in equation (8), if the voltages across each of the current path transistors are approximately equal, then the actual $k_{ILIS}$ factor produced by power MOSFET 12 (i.e., the ratio of the load current to the sensing current) may be equal to the ratio of the on-resistance of the sensing current path transistor to the on-resistance of the main current path transistor.

For each of the current path transistors, the on-resistance may be dependent upon the sizing (e.g., width-to-length ratio) of the transistor. As the effective width-to-length ratio of a transistor increases, the on-resistance of the transistor decreases. Therefore, the ratio of the on-resistance of the main current path transistor to the on-resistance of the sensing current path transistor may be approximately equal to the ratio of the width-to-length ratio of the sensing current path transistor to the width-to-length ratio of the main current path transistor.

The transistor sizing ratio of power MOSFET 12 may refer to the ratio of the width-to-length ratio of the main current path transistor to the width-to-length ratio of the sensing current path transistor. If the voltages across each of the current path transistors are approximately equal, then the actual $k_{ILIS}$ factor produced by power MOSFET 12 may be approximately equal to the transistor sizing ratio of power MOSFET 12.

If power MOSFET 12 is built such that the transistor sizing ratio for power MOSFET 12 is equal to the target $k_{ILIS}$ factor for power MOSFET 12, then configuring power MOSFET 12 to achieve the target $k_{ILIS}$ factor translates into regulating the voltage across each of the current path transistors such that the voltages are equal or approximately equal. Because the sensing current path transistor and the main current path transistor share a common endpoint (i.e., common terminal 18), the condition that the voltages across the current path be equal translates into a condition that the voltages at the non-common endpoints of the current path transistors be equal to each other.

One solution to equalize the voltages at the non-common endpoints is to regulate the voltage at the non-common endpoint of the sensing current path transistor at a voltage that is equal to the voltage at the non-common endpoint of the main current path transistor. However, because of the relatively large size of the main current path transistor, the metallization included on main terminal 22 may be relatively large, and the voltage across the metallization on main terminal 22 may not be uniformly distributed. In other words, different locations on the metallization of main terminal 22 may operate at different voltages, even during steady-state operating conditions. Because the voltage across main terminal 22 may not be uniform, a voltage at any particular location along main terminal 22 may not be representative of the aggregate voltage of the entire main terminal 22. Regulating sensing terminal 20 at a voltage that is not representative of the aggregate voltage of the entire main terminal 22 may introduce errors into the actual $k_{ILIS}$ factor produced by power MOSFET 12.

Another difficulty arises in cases where the non-common endpoint of the sensing current path transistor is regulated via the same terminal through which the sensing current flows (i.e., regulated via a non-Kelvin connection). In such cases, the sensing current may cause a voltage drop across the wiring and interconnect resistances such that there may be a slight offset between the voltage regulated at sensing terminal 20 and the voltage present at the non-common endpoint of the sensing current path transistor. This may introduce an error into the actual $k_{ILIS}$ factor, even if sensing terminal 20 is regulated at the precise aggregate voltage of main terminal 22 unless the voltages at sensing terminal 20 and main terminal 22 are slightly offset from each other to compensate for the voltage drop.

According to this disclosure, measurement circuitry 14 may regulate sensing terminal 20 of power MOSFET 12 based on a configurable function that defines a reference voltage as a function of two or more main terminal voltages (e.g., $V_1$ and $V_2$) that are obtained at two or more different locations (e.g., locations 24 and 26) on a metallization that forms main terminal 22 of power MOSFET 12. For example, measurement circuitry 14 may generate a reference voltage based on the configurable function and the two or more main terminal voltages, and regulate sensing terminal 20 of power MOSFET 12 at a regulation voltage that is determined based on the reference voltage. The configurable function may be configured such that the voltage at which measurement circuitry 14 regulates sensing terminal 20 causes power MOSFET 12 to produce an actual $k_{ILIS}$ factor that is approximately equal to the target $k_{ILIS}$ factor for power MOSFET 12.

Using a configurable function of two or more main terminal voltages to regulate a sensing terminal may allow the regulation voltage to be trimmed such that a $k_{ILIS}$ factor actually produced by power MOSFET 12 is approximately equal to a target $k_{ILIS}$ factor for power MOSFET 12, even in cases where the voltage distribution across main terminal 22 of the power MOSFET is not completely uniform and even in cases where a voltage drop occurs across the wiring and interconnect resistance of sensing terminal 20. In this way, a current sensing power MOSFET may be controlled to produce a $k_{ILIS}$ factor with a relatively high degree of accuracy.

In the example system 10 of FIG. 1, the two or more main terminal voltages may correspond to a first main terminal voltage ($V_1$) that is sensed at first location 24 on the metallization of main terminal 22, and a second main terminal voltage ($V_2$) that is sensed at second location 26 on the metallization of main terminal 22. The main terminal voltages may each be sensed by a respective wire, connection, or other conductor that is electrically coupled to power MOSFET 12 at the respective location.

Measurement circuitry 14 may include circuitry that implements a configurable function that defines a reference voltage as a function of the two or more main terminal voltages. Measurement circuitry 14 may regulate sensing terminal 20 at a voltage ($V_{REG}$) that is determined based on the reference voltage. In some examples, the regulation voltage may be equal to the reference voltage.

In the example system 10 shown in FIG. 1, the configurable function for measurement circuitry 14 may be configured based on a configuration parameter. The configuration parameter may be a mechanically-specified parameter or an electrically-specified parameter. In some examples, the configuration parameter may correspond to a wiper terminal of a potentiometer.

In the example system 10 of FIG. 1, measurement circuitry 14 also receives the sensing current ($I_{SENSE}$) that flows through sensing terminal 20, and generates a measured current ($I_{MONITOR}$) that is indicative of the magnitude of the sensing current. In some examples, the magnitude of the measured current may be equal to the magnitude of the sensing current. Although the conceptual diagram in FIG. 1 illustrates separate arrows for regulating the voltage of sensing terminal 20 and receiving the sensing current flowing through sensing terminal 20 for conceptual purposes, in some examples, measurement circuitry 14 may regulate the voltage at sensing terminal 20 and receive the sensing current flowing through sensing terminal 20 via the same conductor or connection.

The example measurement circuitry 14 illustrated in FIG. 1 performs both voltage regulation functions and current measurement functions. In other example systems, separate circuitry may perform the voltage regulation functions and the current measurement functions. In general, measurement circuitry 14 and/or other circuitry that performs similar voltage regulation functions may be alternatively referred to as voltage regulation circuitry.

Example operation of system 10 will now be described. Initially, the gate-source voltage for power MOSFET 12 is controlled such that power MOSFET 12 operates in the off state. For example, the gate-source voltage may be controlled to be less than a threshold voltage for power MOSFET 12. The threshold voltage for power MOSFET 12 may refer to a gate-source voltage above which power MOSFET 12 begins to conduct current between the source and drain terminals of power MOSFET 12.

When power MOSFET 12 is operating in the off state, no current passes through the main current path or the sensing current path of power MOSFET 12. When power MOSFET 12 is operating in the off state, measurement circuitry 14 may or may not regulate sensing terminal 20. However, no current is measured by measurement circuitry 14 because no current is flowing through power MOSFET 12.

To transition to the on-state, the gate-source voltage for power MOSFET 12 is controlled such that the gate-source voltage is greater than the threshold voltage for power MOSFET 12. When power MOSFET 12 is operating in the on state, current passes through the main current path and the sensing current path. Power MOSFET 12 may split a load current (i.e., $I_{LOAD}$) flowing into common terminal 18 into a main current (i.e., $I_{MAIN}$) that flows through a main current path and a sensing current (i.e., $I_{SENSE}$) that flows through a sensing current path.

The current flowing through the main current path causes a voltage distribution to form along the metallization of main terminal 22. The voltage distribution along the metallization of main terminal 22 may, in some examples, not be uniform. That is, the voltage at different locations (e.g., first location 24 and second location 26) along the metallization that forms main terminal 22 may be different.

Circuitry in measurement circuitry 14 that implements a configurable function may be configured based on a configuration parameter prior to the operation of or during the operation of system 10. In some examples, the configurable function may be configured to implement a particular function that causes power MOSFET 12 to produce an actual $k_{ILIS}$ factor that conforms to the target $k_{ILIS}$ factor for power MOSFET 12.

Measurement circuitry 14 senses the voltages at first location 24 and second location 26 of the metallization that forms main terminal 22. Measurement circuitry 14 generates a reference voltage based on the configurable function. The configurable function may define the reference voltage as a function of the first main terminal voltage ($V_1$) that is sensed at first location 24 on the metallization of main terminal 22, and the second main terminal voltage ($V_2$) that is sensed at second location 26 on the metallization of main terminal 22.

Measurement circuitry 14 regulates sensing terminal 20 at a voltage ($V_{REG}$) that is determined based on the reference voltage that is defined by the configurable function. In some examples, the regulation voltage ($V_{REG}$) may be the same as the reference voltage. In further examples, the regulation voltage may be different than the reference voltage.

Measurement circuitry 14 detects a sensing current ($I_{SENSE}$) that flows through sensing terminal 20 in response to regulating sensing terminal 20 at the regulation voltage ($V_{REG}$). Measurement circuitry 14 outputs a measured current ($I_{MONITOR}$) that is indicative of the magnitude of the sensed current ($I_{SENSE}$). In some examples, the magnitude of the measured current may be the same as the magnitude of the sensed current. In further examples, the magnitude of the measured current may be different than the magnitude of the sensed current.

In some examples, one of first location 24 and second location 26 may correspond to a location on the metallization for main terminal 22 that is determined to carry a maximum voltage across the metallization that forms main terminal 22. In such examples, the other of first location 24 and second location 26 may correspond to a location on the metallization for main terminal 22 that is determined to carry a minimum voltage across the metallization that forms main terminal 22. In such examples, a voltage divider may be able to generate any reference voltage that is between the minimum and maximum voltages of the metallization, thereby allowing a relatively wide voltage range in which an appropriate reference voltage may be used to achieve the target $k_{ILIS}$ factor.

Figure 4:
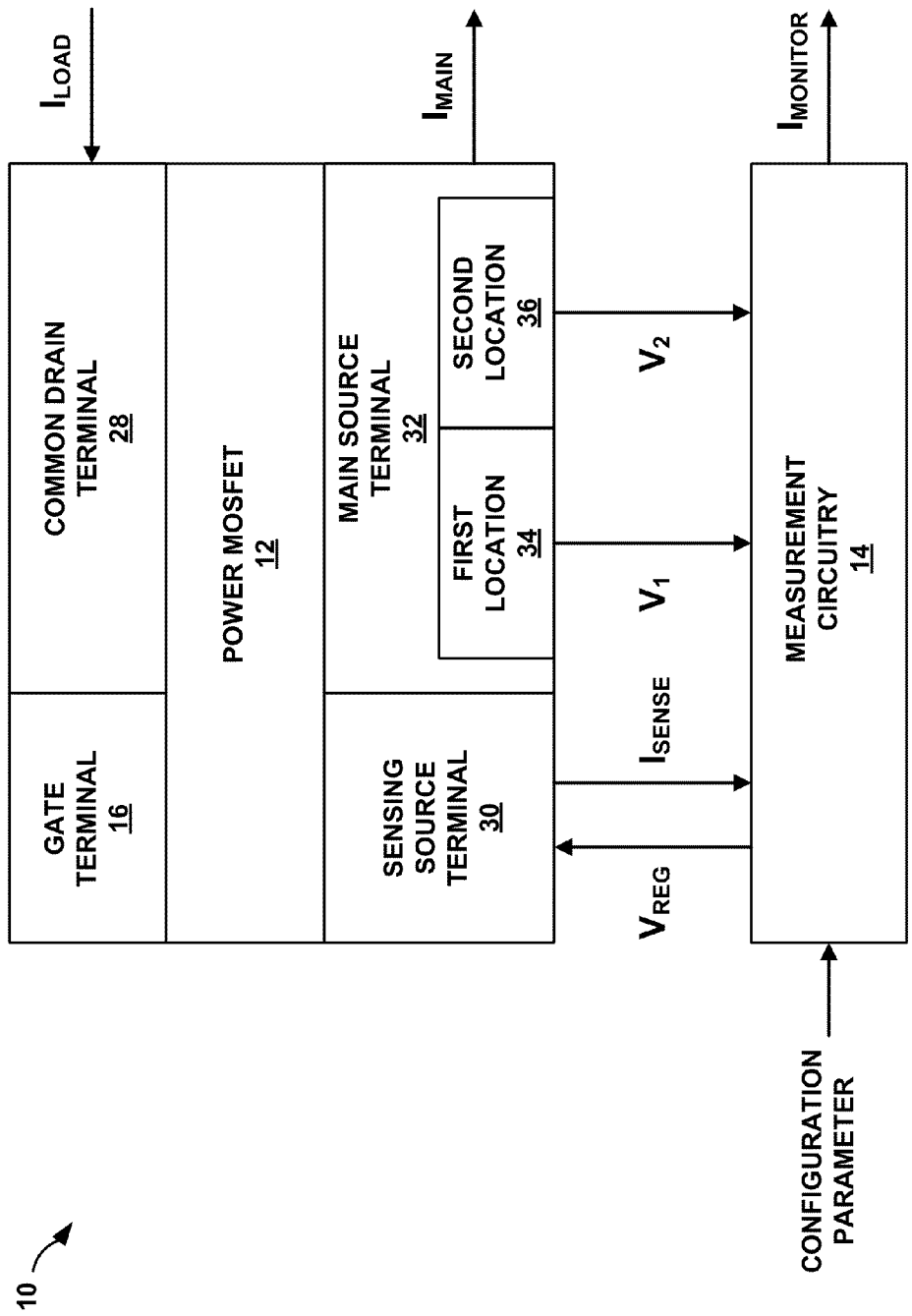
FIG. 4 is a conceptual diagram illustrating the example system of FIG. 1 in which the current sensing power MOSFET has a common drain configuration.

FIG. 4 is a conceptual diagram illustrating the example system 10 of FIG. 1 in which the power MOSFET 12 has a common drain configuration. In the example power MOSFET 12 of FIG. 4, common drain terminal 28 corresponds to common terminal 18 in FIG. 1, sensing source terminal 30 corresponds to sensing terminal 20 in FIG. 1, main source terminal 32 corresponds to main terminal 22 in FIG. 1, first location 34 corresponds to first location 24 in FIG. 1, and second location 36 corresponds to second location 26 in FIG. 1.

A main current path may be formed between common drain terminal 28 and main source terminal 32, and a sensing current path may be formed between common drain terminal 28 and sensing source terminal 30. The main current path may include a main current path transistor that has a drain that is electrically coupled to common drain terminal 28 and a source that is electrically coupled to main source terminal 32. Similarly, the sensing current path may include a sensing current path transistor that has a drain that is electrically coupled to common drain terminal 28 and a source that is electrically coupled to sensing source terminal 30.

In some examples, the current path transistors in the example power MOSFET 12 of FIG. 4 may both be n-channel transistors. In further examples, the current path transistors in the example power MOSFET 12 of FIG. 4 may both be p-channel transistors. In some examples, power MOSFET 12 may implement a low-side switch. In further examples, power MOSFET 12 may implement a high-side switch.

Figure 5:
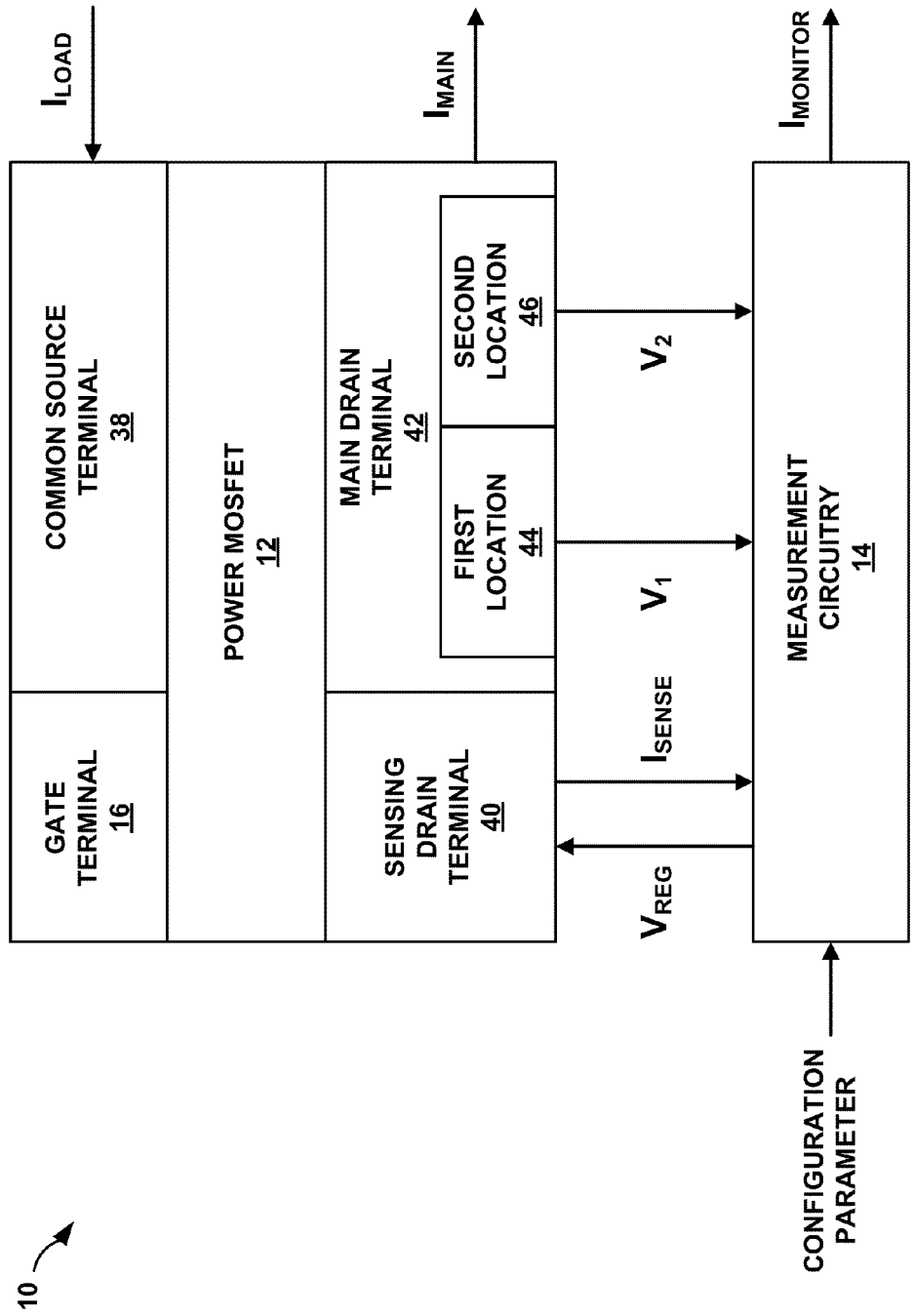
FIG. 5 is a conceptual diagram illustrating the example system of FIG. 1 in which the current sensing power MOSFET has a common source configuration.

FIG. 5 is a conceptual diagram illustrating the example system 10 of FIG. 1 in which the power MOSFET 12 has a common source configuration. In the example power MOSFET 12 of FIG. 5, common source terminal 38 corresponds to common terminal 18 in FIG. 1, sensing drain terminal 40 corresponds to sensing terminal 20 in FIG. 1, main drain terminal 42 corresponds to main terminal 22 in FIG. 1, first location 44 corresponds to first location 24 in FIG. 1, and second location 46 corresponds to second location 26 in FIG. 1.

A main current path may be formed between common source terminal 38 and main drain terminal 42, and a sensing current path may be formed between common source terminal 38 and sensing drain terminal 40. The main current path may include a main current path transistor that has a source that is electrically coupled to common source terminal 38 and a drain that is electrically coupled to main drain terminal 42. Similarly, the sensing current path may include a sensing current path transistor that has a source that is electrically coupled to common source terminal 38 and a drain that is electrically coupled to sensing drain terminal 40.

In some examples, the current path transistors in the example power MOSFET 12 of FIG. 5 may both be n-channel transistors. In further examples, the current path transistors in the example power MOSFET 12 of FIG. 5 may both be p-channel transistors. In some examples, power MOSFET 12 may implement a low-side switch. In further examples, power MOSFET 12 may implement a high-side switch.

Figure 6:
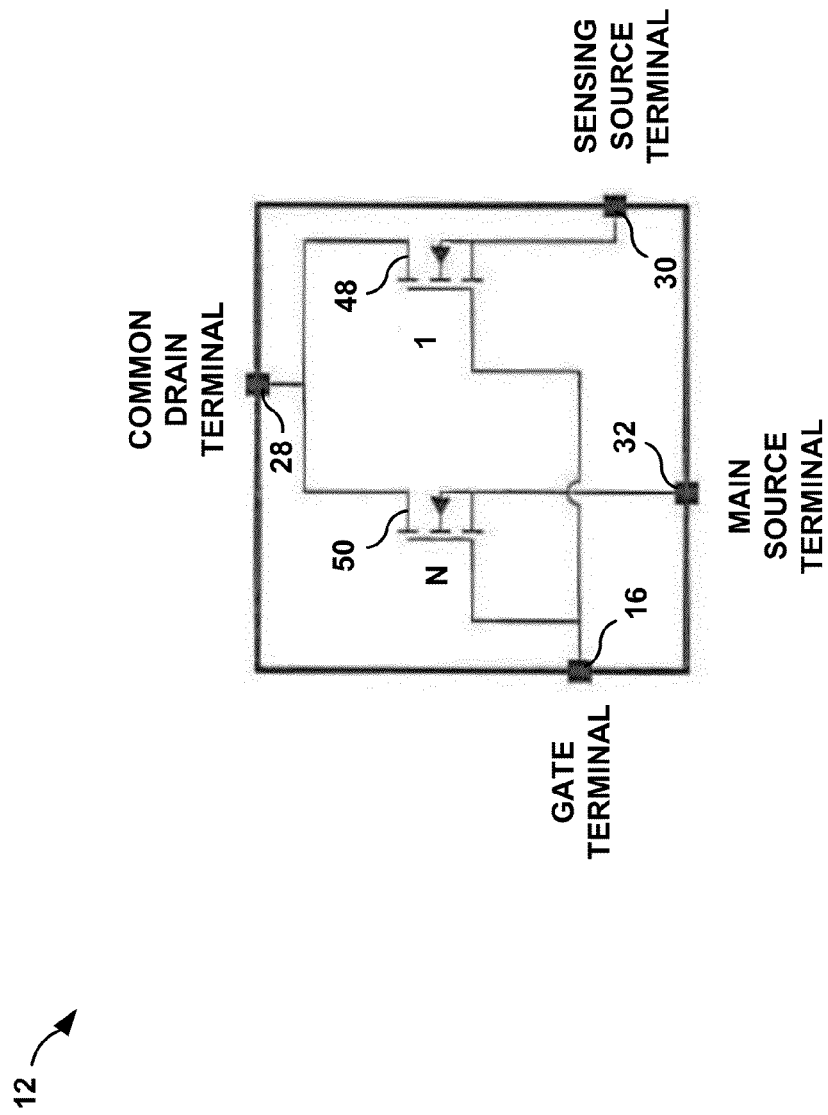
FIG. 6 is a schematic diagram illustrating an example of the current sensing power MOSFET illustrated in FIGS. 1 and 4.

FIG. 6 is a schematic diagram illustrating an example of the power MOSFET 12 illustrated in FIGS. 1 and 4. As shown in FIG. 6, power MOSFET 12 includes a sensing current path transistor 48 and a main current path transistor 50. Both sensing current path transistor 48 and main current path transistor 50 are n-type transistors, and power MOSFET 12 may implement a low-side power MOSFET switch. A drain terminal of sensing current path transistor 48 is electrically coupled to common drain terminal 28 and to a drain terminal of main current path transistor 50. A source terminal of sensing current path transistor 48 is electrically coupled to sensing source terminal 30. A gate terminal of sensing current path transistor 48 is electrically coupled to a gate terminal of main current path transistor 50 and to gate terminal 16. A drain terminal of main current path transistor 50 is electrically coupled to common drain terminal 28 and to a drain terminal of sensing current path transistor 48. A source terminal of main current path transistor 50 is electrically coupled to main source terminal 32. A gate terminal of main current path transistor 50 is electrically coupled to a gate terminal of sensing current path transistor 48 and to gate terminal 16.

As shown in FIG. 6, the transistor sizing ratio is N:1 where N may be any integer greater than or equal to two. The transistor sizing ratio may correspond to the target $k_{ILIS}$ factor for power MOSFET 12.

Although FIG. 6 illustrates each of sensing current path transistor 48 and main current path transistor 50 as a single transistor, in some examples, one or both of sensing current path transistor 48 and main current path transistor 50 may include multiple transistor cells. In some examples, the ratio of the number of transistor cells used to implement main current path transistor 50 to the number of transistor cells used to implement sensing current path transistor 48 may correspond to the transistor sizing ratio of power MOSFET 12.

Figure 7:
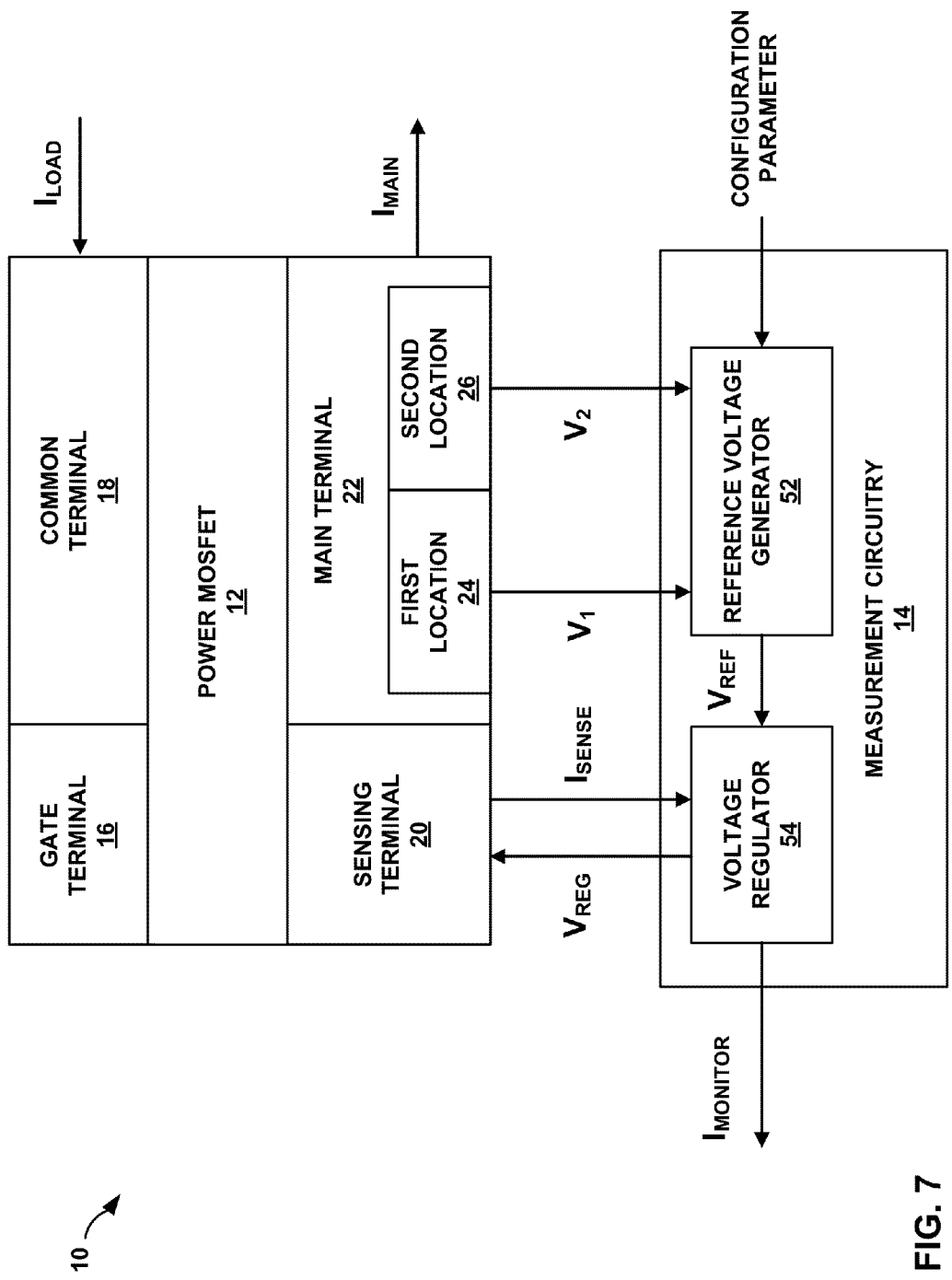
FIG. 7 is a conceptual diagram illustrating the example system of FIG. 1 in which example measurement circuitry is illustrated in greater detail.

FIG. 7 is a conceptual diagram illustrating the example system 10 of FIG. 1 in which example measurement circuitry 14 is illustrated in greater detail. As shown in FIG. 7, measurement circuitry 14 includes a reference voltage generator 52 and a voltage regulator 54.

Reference voltage generator 52 may generate a reference voltage ($V_{REF}$) based on a configurable function that defines the reference voltage as a function of two or more main terminal voltages (e.g., $V_1$ and $V_2$) that are obtained at two or more different locations (e.g., locations 24 and 26) on a metallization that forms main terminal 22 of power MOSFET 12. Voltage regulator 54 may regulate sensing terminal 20 of power MOSFET 12 at a voltage ($V_{REG}$) that is determined based on the reference voltage ($V_{REF}$).

Reference voltage generator 52 may include digital and/or analog circuitry that implements the configurable function that defines the reference voltage as a function of two or more main terminal voltages. The configurable function may be configured by one or more configuration parameters that are received by reference voltage generator 52. The one or more configuration parameters may be mechanically-configurable parameters and/or electrically-configurable parameters. The configurable function may be configured, in some examples, such that a ratio of a main current path current to a sensing current path current is approximately equal to a ratio of a main current path transistor sizing (e.g., width-to-length ratio) to a sensing current path transistor sizing (e.g., width-to-length ratio).

In some examples, the configurable function may be an adjustable voltage divider function. For example, the configurable function may be based on the following equation:

$$V_{REF}=A*V_1+B*V_2 \qquad (9)$$

where $V_{REF}$ is the reference voltage, $V_1$ is a first main terminal voltage that is obtained at first location 24 on the metallization that forms main terminal 22, $V_2$ is a second main terminal voltage that is obtained at second location 26 on the metallization that forms main terminal 22, A+B=1 and where P=B/A is a configurable parameter that defines the configurable function.

In further examples, the configurable function may define the reference voltage such that the reference voltage is equal to a configurable value that is between two of the two or more main terminal voltages. For example, in the example reference voltage generator 52 of FIG. 6, the configurable function may, in some examples, allow the reference voltage ($V_{REF}$) to be configured to be any value between the first main terminal voltage ($V_1$) and the second main terminal voltage ($V_2$) inclusive of the main terminal voltages themselves.

In additional examples, reference voltage generator 52 may include a potentiometer that implements the configurable function. A potentiometer may include two end terminals that are located on opposite sides of a resistive element, and a slidable contact that is configured to move along the resistive element between the two end terminals of the potentiometer.

In examples where reference voltage generator 52 implements the configurable function with a potentiometer, a first end terminal of the potentiometer may be electrically coupled to first location 24 on the metallization that forms main terminal 22, a second end terminal of the potentiometer may be electrically coupled to second location 26 on the metallization that forms main terminal 22, and a wiper terminal of the potentiometer may produce the reference voltage. The wiper terminal of the potentiometer may be electrically coupled to an adjustable wiper of the potentiometer. The adjustable wiper of the potentiometer may be, for example, a slidable contact that is configured to move along a resistive element in the potentiometer.

During or after manufacture of system 10, the adjustable wiper of the potentiometer may be adjusted such that sensing terminal 20 of power MOSFET 12 is regulated at a voltage that causes the actual $k_{ILIS}$ factor of power MOSFET 12 to be substantially equal to the target $k_{ILIS}$ factor of power MOSFET 12. In this way, power MOSFET 12 may be controlled to produce a $k_{ILIS}$ factor with a relatively high degree of accuracy, even in cases where the voltage distribution across main terminal 22 of power MOSFET 12 is not completely uniform and even in cases where a voltage drop occurs across the wiring and interconnect resistances of sensing terminal 20.

Voltage regulator 54 may receive the reference voltage ($V_{REF}$) from reference voltage generator 52, and regulate sensing terminal 20 of power MOSFET 12 at a regulation voltage ($V_{REG}$) that is determined based on the reference voltage ($V_{REF}$). The regulation voltage ($V_{REG}$) may be the same as or different than the reference voltage ($V_{REF}$).

Voltage regulator 54 may include digital and/or analog circuitry that is configured to regulate sensing terminal 20 at a voltage that is determined based on the reference voltage. In some examples, voltage regulator 54 may include an operational amplifier-based control loop that is controlled based on the reference voltage received from reference voltage generator 52.

In examples where voltage regulator 54 includes an operational amplifier-based control loop, the control loop may include an operational amplifier where a non-inverting input of the operational amplifier is electrically coupled to the reference voltage. A feedback loop may be formed between an output of the operational amplifier and an inverting input of the operational amplifier, and the inverting input of the operational amplifier may be electrically coupled to sensing terminal 20 of power MOSFET 12.

Voltage regulator 54 may detect a sensing current ($I_{SENSE}$) that flows through sensing terminal 20 in response to regulating sensing terminal 20 at the regulation voltage ($V_{REG}$). Measurement circuitry 14 may output a measured current ($I_{MONITOR}$) that is indicative of the magnitude of the sensed current ($I_{SENSE}$). In some examples, the magnitude of the measured current may be the same as the magnitude of the sensed current. In further examples, the magnitude of the measured current may be different than the magnitude of the sensed current.

Figure 8:
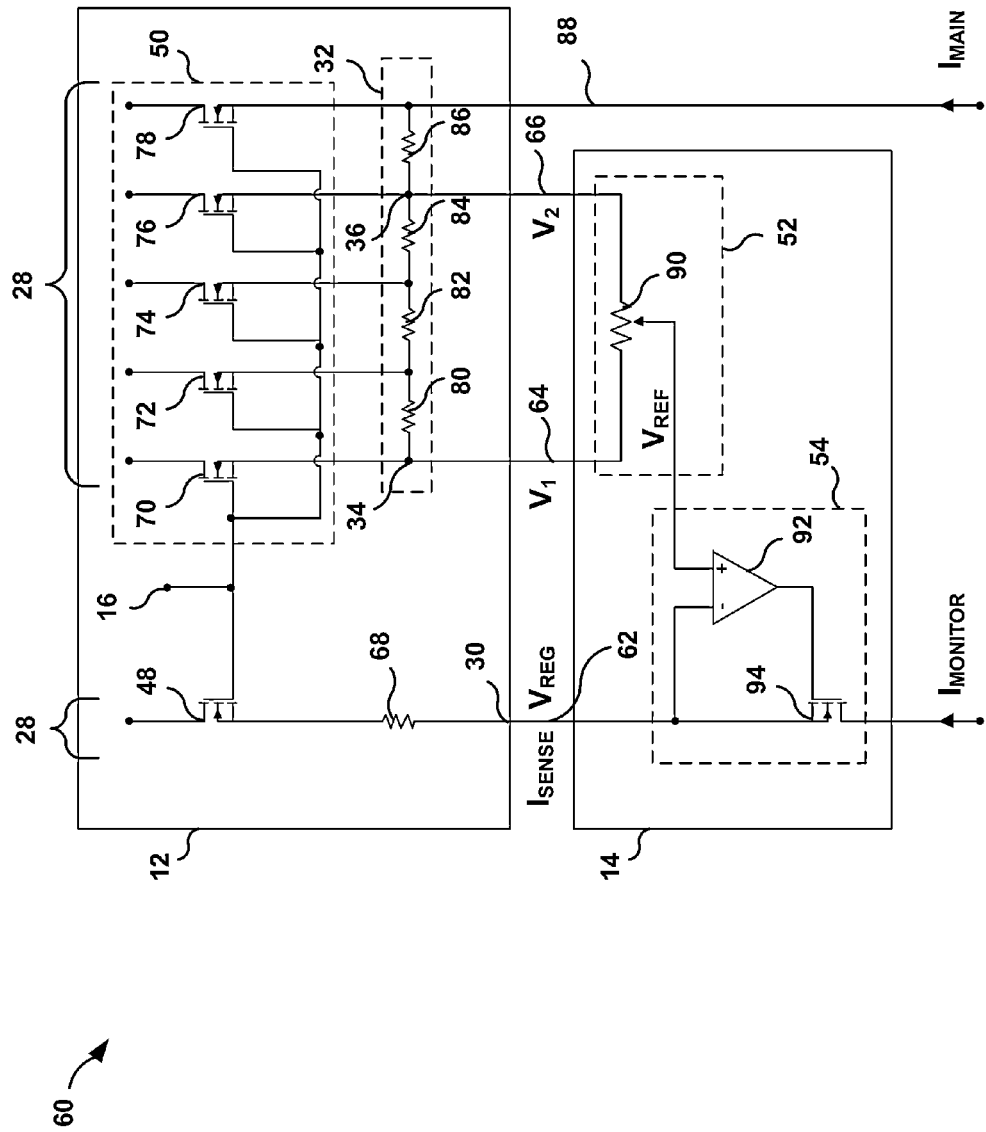
FIG. 8 is a schematic diagram illustrating an example circuit that implements the systems shown in FIGS. 1, 4 and 6.

FIG. 8 is a schematic diagram illustrating an example circuit 60 that implements the systems shown in FIGS. 1, 4 and 6. Circuit 60 includes power MOSFET 12 and measurement circuitry 14. Power MOSFET 12 is electrically coupled to measurement circuitry 14 via connections 62, 64, 66. Each of connections 62, 64, 66 may be implemented, for example, as a respective conductor that is connected between respective terminals of power MOSFET 12 and measurement circuitry 14.

Power MOSFET 12 includes a sensing current path transistor 48, a main current path transistor 50, a resistance 68, a gate terminal 16, a common drain terminal 28, a sensing source terminal 30, and a main source terminal 32. In some examples, each of sensing current path transistor 48 and main current path transistor 50 may correspond to a double-diffused metal-oxide-semiconductor (DMOS) transistor.

Main current path transistor 50 includes transistor cells 70, 72, 74, 76, 78. Transistor cells 70, 72, 74, 76, 78 may be electrically coupled to each other in parallel. For example, each of the drains of transistor cells 70, 72, 74, 76, 78 may be electrically coupled to each other to form a drain for main current path transistor 50, each of the gates of transistor cells 70, 72, 74, 76, 78 may be electrically coupled to each other to form a gate for main current path transistor 50, and each of the sources of transistor cells 70, 72, 74, 76, 78 may be electrically coupled to each other (e.g., electrically coupled to each other via main source terminal 32) to form a source for main current path transistor 50.

The drain of main current path transistor 50 is electrically coupled to the drain of sensing current path transistor 48 to form common drain terminal 28 for power MOSFET 12, and the gate of main current path transistor 50 is electrically coupled to the gate of sensing current path transistor 48 to form gate terminal 16 for power MOSFET 12. The source of main current path transistor 50 forms main source terminal 32 of power MOSFET 12. The source of sensing current path transistor 48 is electrically coupled to sensing source terminal 30 of power MOSFET 12 via resistance 68. Resistance 68 may represent wiring and/or interconnect resistances associated with sensing source terminal 30.

Main source terminal 32 may include a metallization that encompasses the sources of each of transistor cells 70, 72, 74, 76, 78. Because of the relatively large size of main current path transistor 50, the metallization included on main terminal 32 may be relatively large, and the voltage across the metallization on main terminal 32 may not be uniformly distributed. The non-uniform distribution of the voltage across main terminal 32 is represented by resistances 80, 82, 84, 86. Each of resistances 80, 82, 84, 86 represents an effective voltage drop that may occur between different locations on the metallization that forms main terminal 32.

As shown in FIG. 8, connection 64 is electrically coupled to main source terminal 32 at first location 34, and connection 66 is electrically coupled to main source terminal 32 at second location 36. First location 34 and second location 36 may be different locations on the metallization that forms main source terminal 32, and resistances 80, 82, and 84 between first location 34 and second location 36 may indicate that the voltages at first location 34 and second location 36 may be different.

In the example shown in FIG. 8, main current path connection 88 is illustrated as being electrically coupled to main source terminal 32 at a location that is different than both of first location 34 and second location 36. However, in other examples, main current path connection 88 may be electrically coupled to main source terminal 32 at a location that is the same as one of first location 34 and second location 36. In such examples, main current path connection 88 may still be a separate connection from connections 64 and 66.

Measurement circuitry 14 includes reference voltage generator 52 and voltage regulator 54. Reference voltage generator 52 includes a potentiometer 90. Voltage regulator 54 includes an operational amplifier 92 and a transistor 94. In some examples, transistor 94 may be an n-channel MOSFET (NMOS) transistor.

A first end of potentiometer 90 is electrically coupled to main source terminal 32 at first location 34 via connection 64. A second end of potentiometer 90 is electrically coupled to main source terminal 32 at second location 36 via connection 66. A wiper terminal of potentiometer 90 is electrically coupled to a non-inverting input terminal of operational amplifier 92. An inverting input terminal of operational amplifier 92 is electrically coupled to a source terminal of transistor 94 and to sensing source terminal 30 of power MOSFET 12 via connection 62. An output terminal of operational amplifier 92 is electrically coupled to a gate of transistor 94. A drain of transistor 94 produces the measured current (i.e., $I_{MONITOR}$).

Potentiometer 90 may implement a configurable function that generates the reference voltage ($V_{REF}$) as a function of a first main terminal voltage ($V_1$) that is sensed at first location 34 on a metallization that forms main source terminal 32, and a second main terminal voltage ($V_2$) that is sensed at second location 36 on a metallization that forms main source terminal 32. Operational amplifier 92 and transistor 94 may implement an operational-amplifier based control loop that regulates sensing source terminal 30 at a voltage ($V_{REG}$) that is approximately equal to the reference voltage ($V_{REF}$) received from reference voltage generator 52.

Example operation of system 10 illustrated in FIG. 8 will now be described. Initially, the gate-source voltage for power MOSFET 12 is controlled such that power MOSFET 12 operates in the off state. When power MOSFET 12 is operating in the off state, main current path transistor 50 and sensing current path transistor 48 also operate in the off state and do not conduct current. When power MOSFET 12 is operating in the off state, measurement circuitry 14 may or may not regulate sensing source terminal 30. However, no current is measured by measurement circuitry 14 because no current is flowing through power MOSFET 12.

The gate-source voltage for power MOSFET 12 may be controlled to transition power MOSFET 12 to the on state. When power MOSFET 12 is operating in the on state, current passes through main current path transistor 50 and sensing current path transistor 48. Power MOSFET 12 may split a load current flowing into common drain terminal 28 into a main current (i.e., $I_{MAIN}$) that flows through a main current path and a sensing current (i.e., $I_{SENSE}$) that flows through a sensing current path.

The current flowing through the main current path causes a voltage distribution to form along the metallization of main source terminal 32. The voltage distribution along the metallization of main source terminal 32 may, in some examples, not be uniform. That is, the voltage at different locations (e.g., first location 34 and second location 36) along the metallization that forms main source terminal 32 may be different.

The wiper terminal of potentiometer 90 may be configured prior to the operation of or during the operation of system 60 to implement a particular voltage divider function. In some examples, the voltage divider function may be configured to cause power MOSFET 12 to produce an actual $k_{ILIS}$ factor that conforms to the target $k_{ILIS}$ factor for power MOSFET 12.

Reference voltage generator 52 senses the voltage at first location 34 and second location 36 of the metallization that forms main source terminal 32. Potentiometer 90 generates a reference voltage based on the configurable function. The configurable function may define the reference voltage ($V_{REF}$) as a function of the first main terminal voltage ($V_1$) that is sensed at first location 34 on the metallization of main source terminal 32, and the second main terminal voltage ($V_2$) that is sensed at second location 36 on the metallization of main source terminal 32. In this example, the configurable function may be a configurable voltage divider function. The voltage divider function may produce a reference voltage that is between the first main terminal voltage and the second main terminal voltage. The wiper of potentiometer 90 may be adjusted to change the reference voltage.

Operational amplifier 92 regulates sensing source terminal 30 at a voltage ($V_{REG}$) that is determined based on the reference voltage ($V_{REF}$) which is defined by the configurable function. In this example, the regulation voltage ($V_{REG}$) is approximately equal to the reference voltage ($V_{REF}$).

The feedback loop formed by operational amplifier 92 and transistor 94 causes transistor 94 to operate in an on state and allows the sensing current ($I_{SENSE}$) at sensing source terminal 30 to flow through transistor 94 to output the measured current ($I_{MONITOR}$). In this example, the magnitude of the measured current ($I_{MONITOR}$) is approximately equal to the magnitude of the sensing current ($I_{SENSE}$).

As discussed above, because of the relatively large size of main current path transistor 50, the metallization included on main source terminal 32 may be relatively large, and the voltage across the metallization on main source terminal 32 may not be uniformly distributed. The non-uniform distribution of the voltage across main source terminal 32 is represented by resistances 80, 82, 84, 86 in FIG. 8. Each of resistances 80, 82, 84, 86 represents an effective voltage drop that may occur between different locations on the metallization that forms main source terminal 32. For example, the voltage at first location 34 may not be equal to the voltage at second location 36 on the same metallization that forms main source terminal 32. Because the voltage across main source terminal 32 may not be uniform, a voltage at any particular location along main source terminal 32 may not be representative of the aggregate voltage of the entire main source terminal 32. Regulating sensing source terminal 30 at a voltage that is not representative of the aggregate voltage of the entire main source terminal 32 may introduce errors into the actual $k_{ILIS}$ factor produced by power MOSFET 12.

According to this disclosure, potentiometer 90 may implement a configurable function that defines a reference voltage as a function of two main terminal voltages that are obtained at two different locations (e.g., first location 34 and second location 36) on a metallization that forms main source terminal 32. Voltage regulator 54 may regulate sensing source terminal 30 at a voltage that is determined based on the reference voltage. Using a configurable function of two or more main terminal voltages to regulate the sensing terminal of power MOSFET 12 may allow the regulation voltage to be trimmed such that a $k_{ILIS}$ factor actually produced by power MOSFET 12 is approximately equal to a target $k_{ILIS}$ factor for power MOSFET 12, even in cases where the voltage distribution across main source terminal 32 is not completely uniform. In this way, power MOSFET 12 may be controlled to produce a $k_{ILIS}$ factor with a relatively high degree of accuracy.

It has previously been shown in equation (6) that:

$$k_{ILIS} = \frac{I_{LOAD}}{I_{SENSE}} \cong \frac{R_{ON\_SENSE}}{R_{ON\_MAIN}} \cdot \frac{V_{MAIN}}{V_{SENSE}} \tag{10}$$

where $k_{ILIS}$ corresponds to the $k_{ILIS}$ factor, $I_{LOAD}$ corresponds to the load current, $I_{SENSE}$ corresponds to the sensing current, $V_{SENSE}$ corresponds to the voltage across the sensing current path transistor, $V_{MAIN}$ corresponds to the voltage across the main current path transistor, $R_{ON\_SENSE}$ corresponds to the on resistance of the sensing current path transistor, and $R_{ON\_MAIN}$ corresponds to the on resistance of the main current path transistor.

Because main current path transistor 50 and sensing current path transistor 48 in the example circuit 60 of FIG. 8 are both n-channel devices with shared drains and gates, and with separate sources, equation (10) may be rewritten as:

$$k_{ILIS} \cong \frac{R_{ON\_SENSE}}{R_{ON\_MAIN}} \cdot \frac{V_{MAIN}}{V_{SENSE}} = \frac{R_{ON\_SENSE}}{R_{ON\_MAIN}} \cdot \frac{V_{DRAIN} - V_{SOURCE\_MAIN}}{V_{DRAIN} - V_{SOURCE\_SENSE}} \quad (11)$$

$$= \frac{R_{ON\_SENSE}}{R_{ON\_MAIN}} \cdot \frac{V_{DRAIN} - V_{SOURCE\_MAIN} - V_{SOURCE\_SENSE} + V_{SOURCE\_SENSE}}{V_{DRAIN} - V_{SOURCE\_SENSE}} \quad (12)$$

$$= \frac{R_{ON\_SENSE}}{R_{ON\_MAIN}} \cdot \left(1 + \frac{V_{SOURCE\_SENSE} - V_{SOURCE\_MAIN}}{V_{DRAIN} - V_{SOURCE\_SENSE}}\right) \quad (13)$$

$$= K_0 \cdot \left(1 + \frac{V_{SOURCE\_SENSE} - V_{SOURCE\_MAIN}}{V_{DRAIN} - V_{SOURCE\_SENSE}}\right) \quad (14)$$

where $k_{ILIS}$ corresponds to the $k_{ILIS}$ factor, $I_{LOAD}$ corresponds to the load current, $I_{SENSE}$ corresponds to the sensing current, $V_{SENSE}$ corresponds to the voltage across the sensing current path transistor, $V_{MAIN}$ corresponds to the voltage across the main current path transistor, $R_{ON\_SENSE}$ corresponds to the on resistance of the sensing current path transistor, and $R_{ON\_MAIN}$ corresponds to the on resistance of the main current path transistor, $V_{DRAIN}$ corresponds to the voltage at the drain terminals of the main current path transistor and the sensing current path transistor, $V_{SOURCE\_MAIN}$ corresponds to the voltage at the source terminal of the main current path transistor, and $V_{SOURCE\_SENSE}$ corresponds to the voltage at the source terminal of the sensing current path transistor.

In equation (14), $K_0$ is a constant that depends on the technology of the particular power MOSFET at hand. Therefore it may be subject to process variations. The term $V_{DRAIN}$ may be a constant for a given $I_{LOAD}$. The term $V_{SOURCE\_MAIN}$ may also a constant for a given $I_{LOAD}$, and may represent the aggregate voltage on the source metallization of the main MOSFET.

Based on the above-mentioned factors, it may be said that the $k_{ILIS}$ factor is a function of $V_{SOURCE\_SENSE}$. That is:

$$k_{ILIS} = f(V_{SOURCE\_SENSE}) \quad (15)$$

Figure 9:
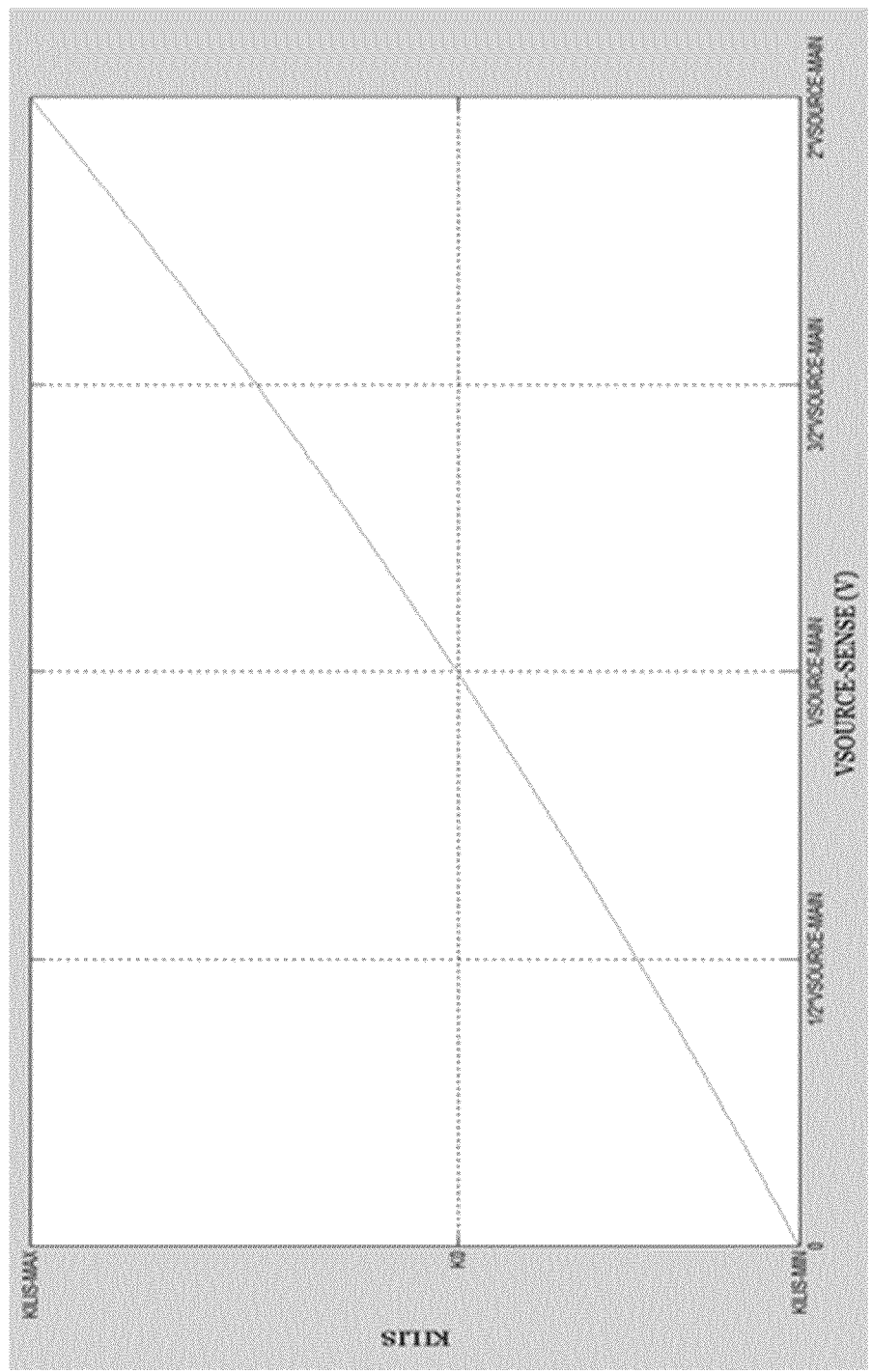
FIG. 9 is a diagram illustrating a plot of the $k_{ILIS}$ factor of a power MOSFET as a function of the voltage at the source terminal of a sensing current path resistor of the power MOSFET.

FIG. 9 is a diagram illustrating a plot of the $k_{ILIS}$ factor of a power MOSFET as a function of the voltage (i.e., $V_{SOURCE\_SENSE}$) at the source terminal of the sensing current path resistor of the power MOSFET. As shown in FIG. 9, the range of variation of $V_{SOURCE\_SENSE}$ goes from 0 to $2*V_{SOURCE\_MAIN}$. This range may correspond to the range between the voltages $V_1$ and $V_2$ shown in FIG. 8. As further shown in FIG. 9, the larger the range encompassed by $V_1$ and $V_2$ the larger the range for the trimming of the $k_{ILIS}$ factor.

Returning to FIG. 8, connections 64 and 66 may be Kelvin connections. In other words, no current or a relatively small amount of current may flow through connections 64 and 66 due to the high input impedance present at the terminals of measurement circuitry 14 that are coupled to connections 64 and 66. On the other hand, connection 62 may not be a Kelvin connection. In other words, the connection (i.e., connection 62) that is used to regulate the voltage at sensing source terminal 30 may be the same connection through which the sensing current flows. In such cases, the sensing current may cause a voltage drop across the wiring and interconnect resistances (which are represented by resistance 68) such that there may be a slight offset between the voltage regulated at sensing source terminal 30 and the voltage present at the source of sensing current path transistor 48. This may introduce an error into the actual $k_{ILIS}$ factor, even if sensing source terminal 30 is regulated at the precise aggregate voltage of main source terminal 32 unless the voltages at sensing source terminal 30 and main source terminal 32 are slightly offset from each other to compensate for the voltage drop.

As discussed above, potentiometer 90 may implement a configurable function that defines a reference voltage that is used for regulating sensing source terminal 30. The configurable function may allow the voltage at which sensing source terminal 32 is regulated to be trimmed during or after manufacture so as to compensate for an offset that occurs due to the wiring and interconnect resistance (e.g., resistance 68) of sensing source terminal 32. In this way, an accurate $k_{ILIS}$ factor may be achieved even in cases where a voltage drop occurs across resistance 68.

In some examples, potentiometer 90 may allow any voltage between a first main terminal voltage ($V_1$) at first location 34 and the second main terminal voltage ($V_2$) at second location 36 to be selected as the reference voltage and/or regulated voltage. The aggregate voltage across main source terminal 32 may be a voltage that is between the highest and lowest voltages on the metallization that forms main source terminal 32. In some examples, the voltage taps for first location 34 and second location 36 may be located at locations on the metallization of first location 34 where approximately the highest and lowest voltages are determined to be located. In such examples, the aggregate voltage across main source terminal 32 may be between the voltages sensed at the main terminal voltages taps. If the aggregate voltage across main source terminal 32 is between the voltages sensed at the main terminal voltages taps, then potentiometer 90 may be configured to generate an appropriate reference voltage for achieving the target $k_{ILIS}$ factor. Using potentiometer 90 (or another configurable voltage divider) allows a configurable function that is relatively easy-to-adjust to be implemented with relatively few circuit components.

Figure 10:
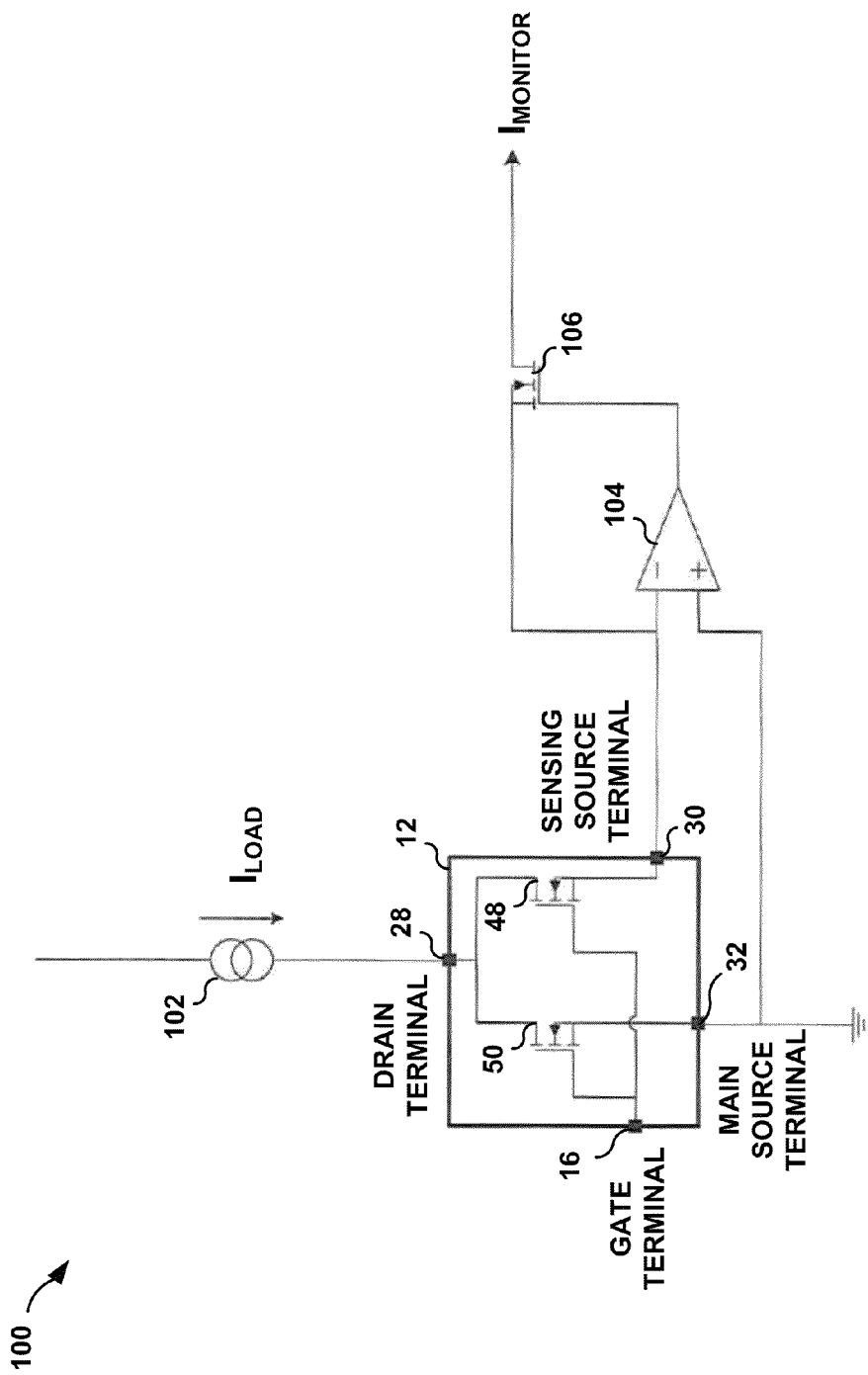
FIG. 10 is a schematic diagram illustrating an example measurement system.

FIG. 10 is a schematic diagram illustrating an example measurement system 100. Measurement system 100 includes the power MOSFET 12 shown in FIG. 6, a load current source 102, an operational amplifier 104, and a transistor 106. FIG. 10 illustrates another technique for regulating the sensing source terminal 30 of a power MOSFET 12. As shown in FIG. 10, operational amplifier 104 regulates sensing source terminal 30 based on a single voltage tap located on main source terminal 32 such that the voltage at sensing source terminal 30 is approximately equal to the voltage at main source terminal 32.

Notably, the regulation technique shown in FIG. 10 does not use multiple voltages that are obtained at two different locations located on main source terminal 32 to determine a voltage at which to regulate sensing source terminal 30. Therefore, if the single voltage tap on the metallization is not representative of the aggregate voltage for the entire metallization of main source terminal 32, then the voltage at sensing source terminal 30 may not equal the aggregate voltage for the entire metallization of main source terminal 32, which may cause the actual $k_{ILIS}$ factor produced by power MOSFET 12 to be offset from the target $k_{ILIS}$ factor.

In addition, the regulation technique shown in FIG. 10 does not use a configurable function of two or more main terminal voltages that are obtained at least two different locations on main source terminal 32 to define a reference voltage that is used for regulating sensing source terminal 30. Therefore, the measurement system 100 shown in FIG. 10 is not capable of being calibrated during or after manufacture to determine the appropriate voltage at which to regulate sensing source terminal 30 to achieve the target $k_{ILIS}$ factor for power MOSFET 12. For example, the regulation voltage in the measurement system 100 of FIG. 10 is not configurable to compensate for the non-uniform distribution of voltages across the metallization that forms main source terminal 32 or to compensate for a voltage drop that may occur across the wiring and interconnect resistances for sensing source terminal 30.

The techniques described in this disclosure, however, may regulate a sensing source terminal 30 of a power MOSFET 12 at a configurable regulation voltage. The configurable regulation voltage may be defined using a configurable function. The configurable function may define a reference voltage as a function of two or more main terminal voltages that are obtained at two or more different locations on a metallization that forms main source terminal 32 of power MOSFET 12. The reference voltage may be used to determine the regulation voltage to use for regulating sensing source terminal 30.

Using a configurable function of two or more main terminal voltages to regulate a sensing terminal may allow the regulation voltage to be trimmed such that a $k_{ILIS}$ factor actually produced by power MOSFET 12 is approximately equal to a target $k_{ILIS}$ factor for power MOSFET 12, even in cases where the voltage distribution across main source terminal 32 of the power MOSFET is not completely uniform and even in cases where a voltage drop occurs across the wiring and interconnect resistance of sensing source terminal 30. In this way, a current sensing power MOSFET may be controlled to produce a $k_{ILIS}$ factor with a relatively high degree of accuracy.

Figure 11:
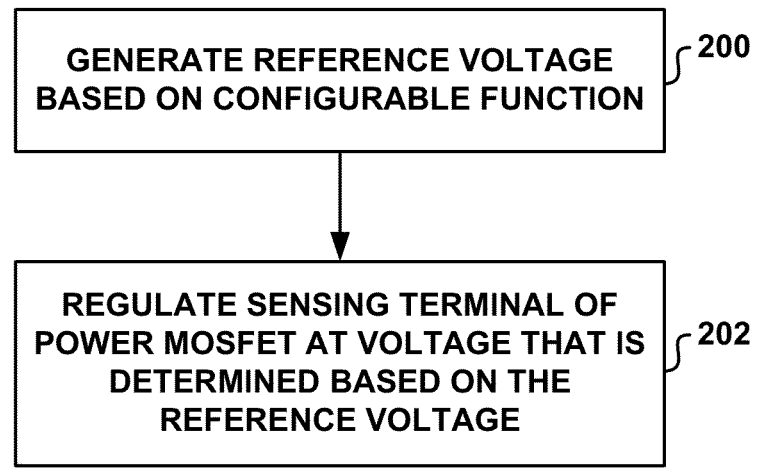
FIG. 11 is a flow diagram illustrating an example technique for regulating a $k_{ILIS}$ factor of a current sensing power MOSFET according to this disclosure.

FIG. 11 is a flow diagram illustrating an example technique for regulating the $k_{ILIS}$ factor of a current sensing power MOSFET according to this disclosure. The technique illustrated in FIG. 11 may be performed, in some examples, with any of the measurement systems shown in FIGS. 1-8 of this disclosure. For ease of description, however, the technique will be described with respect to measurement circuitry 14 shown in FIG. 1.

Measurement circuitry 14 generates a reference voltage based on a configurable function that defines the reference voltage as a function of two or more main terminal voltages (e.g., $V_1$ and $V_2$) that are obtained at two or more different locations (e.g., locations 24, 26) on a metallization that forms a main terminal 22 of a current sensing power MOSFET 12 (200). Measurement circuitry 14 regulates a sensing terminal 20 of the current sensing power MOSFET 12 at a voltage that is determined based on the reference voltage (202).

In some examples, the configurable function may be an adjustable voltage divider function. In further examples, the configurable function may define the reference voltage such that the reference voltage is equal to a configurable value that is between two of the two or more main terminal voltages. In additional examples, the configurable function may be configured such that a ratio of a main current path current to a sensing current path current is approximately equal to a ratio of a main current path transistor sizing (e.g., width-to-length ratio) to a sensing current path transistor sizing (e.g., width-to-length ratio).

In some examples, measurement circuitry 14 may generate the reference voltage with a potentiometer 90 (see e.g., FIG. 8) that implements the configurable function. In such examples, the two or more locations on the metallization of main source terminal 32 may include, in some examples, a first location 34 on the metallization and a second location 36 on the metallization, a first end terminal of potentiometer 90 may be electrically coupled to first location 34 on the metallization, a second end terminal of potentiometer 90 may be electrically coupled to second location 36 on the metallization, and the reference voltage (e.g., $V_{REF}$) may be produced at a wiper terminal of potentiometer 90. The wiper terminal may be electrically coupled to an adjustable wiper of potentiometer 90.

In further examples, measurement circuitry 14 may regulate sensing source terminal 30 (see e.g., FIG. 8) with an operational amplifier-based control loop (e.g., operational amplifier 92 and transistor 94) that is controlled based on the reference voltage (e.g., $V_{REF}$). In such examples, the operational amplifier-based control loop may, in some examples, include an operational amplifier 92. A non-inverting input of operational amplifier 92 may be electrically coupled to the reference voltage (e.g., $V_{REF}$), a feedback loop may be formed between an output of operational amplifier 92 and an inverting input of operational amplifier 92, and the inverting input of operational amplifier 92 may be electrically coupled to sensing source terminal 30 of power MOSFET 12.

In some examples, sensing terminal 20 may be a sensing source terminal 30 (FIG. 4), and main terminal 22 may be a main source terminal 32 (FIG. 4). In additional examples, sensing terminal 20 may be a sensing drain terminal 40 (FIG. 5), and main terminal 22 may be a main drain terminal 42 (FIG. 5).

In some examples, the techniques in this disclosure may be used in a system that implements a switched power converter. In such examples, a subset of elements in the system may include power switches. In some examples, the system that implements the switched power converter may include a driver, and the system may perform power switch current monitoring. In such systems, the current flowing through the power switches (e.g., high-side or low-side switches) may be monitored by using a particular partitioning of the power switch. A MOSFET power switch may be implemented by a parallel arrangement of many unitary cells, some of which are used as a sensing element to monitor a portion of the current flowing into the switch. The portion of the current flowing into the switch that is monitored by the sensing element may be proportional to the load switch current.

In order to obtain a precise mirroring ratio of N:1, in some examples, all source terminals or all drain terminals of the switches may be subject to the same potential. While this may, in some examples, be inherently the case for the gate and common terminals of a MOSFET power switch, that may not be the case for the main terminal and the mirror terminal (i.e., the sensing terminal).

FIG. 10 illustrates a current monitoring application for a low side switch. The measurement system 100 shown in FIG. 10 may, in some examples, be integrated in a circuit that is driving the switch in order to achieve improved timing. As shown in FIG. 10, an operational amplifier may be used to set the same potential on the two free terminals, and to read out the current flowing through the sensing element. The operational amplifier in FIG. 10 may force sensing source terminal 30 (i.e., the mirror source) to be the same potential that is sensed at the main source terminal 32. The implementation shown in FIG. 10, however, does not specify the definition of the main source potential. For example, main source terminal 32 may be spread throughout the switch area. The current density across the surface of main source terminal 32 may be non-constant and may depend on process and/or packaging constraints. As a result, the voltage potential across main source terminal 32 may not be unique and may follow a distribution depending on process, metallization and package. Therefore, an issue arises as to how to determine which source surface potential is best to apply to the current reading circuit in order to regulate sensing source terminal 30 so that the actual $k_{ILIS}$ factor is as accurate as possible.

One solution for selecting a source potential to apply to sensing source terminal 30 involves simulating the potential distribution across the main source metallization in order to determine the position of the most suitable potential to be given to the current reading circuit. In some examples, more than one tapping point may be considered over main source terminal 32 and combined into a single output, thereby offering a single output for obtaining a suitable main source potential. However, this approach suffers from manufacturing process inaccuracies because the source tap position may be determined once and for all prior to the switch device fabrication. Such a system does not consider any possible change to the given main source tapping.

In some examples, the techniques of this disclosure may solve one or more of the above-mentioned problems. For example, using simulations that involve package implementation and metallization, the two points of the source surface (e.g., main source terminal 32 or main terminal 22) where the highest and lowest potential are respectively located may be found. These two potentials (i.e., voltages) may be output through two different pins as an output for a sensing circuit (see, e.g., FIG. 8).

In some examples, a basechip (e.g., power MOSFET 12) may include a main switch, a sensing cell, a metallization and a switch package. In such examples, the two source potentials (e.g., maximum and minimum) may be coupled to the current reading circuit through a trimmable voltage divider (e.g., a resistor divider). The voltage divider may be located on the current reading front end side (e.g., front end side of measurement circuitry 14). At a system level, a test load current may, in some examples, be sent through the switch and the resistive divider may be trimmed (e.g., continuously or in steps) in order to obtain the best possible matching between the load current and the read current. In this way, inaccuracies due to manufacturing can be evened out.

In the example system 60 shown in FIG. 8, the $k_{ILIS}$ factor may be, in some examples, a ratio of 10000:1. In some examples, the resistance between the two main source taps ($V_1$ and $V_2$) may be relatively low due to the power metallization. In such examples, the total resistance of the trimmable voltage divider may not be an issue, and $V_1$ and $V_2$ may appear almost as ideal voltage sources.

In some examples, the techniques of this disclosure may apply a trimming method for current monitoring circuits at a system level. For example, a system may include a power switch, which may include a main switch element (e.g., main current path transistor) and a mirroring element (e.g., sensing current path transistor). The mirroring element may be a subset of conducting cells of the main switch. In such examples, the system may further include a current reading front end that reads a suitable potential over an area of the main switch terminal that is not shared between main switch and mirroring element and regulates the mirroring element terminal that is not shared between main switch and the mirroring element.

The potential over the area of the main switch terminal that is not shared between main switch and mirroring element may reflect a potential distribution depending on manufacturing process, metallization and packaging of the switch device. This distribution may show points of maximum and minimum. The points of maximum and minimum potentials (e.g., two points) may be identified and provided as an output for the current reading front end (e.g., measurement circuitry 14).

The current reading front end may use a combination of the offered potentials obtained through a voltage divider connected between the offered potentials. The combination of potentials may be trimmed using a voltage divider that is trimmable. In some examples, the target of the trimming may be to obtain a maximum accuracy in the current reading applied to the switch mirroring element while the main switch is conducting a load current.

Various techniques described in this disclosure may be implemented in hardware, software, firmware or any combination thereof. For example, various aspects of the techniques may be implemented within or in conjunction with one or more microprocessors, digital signal processors (DSPs), application specific integrated circuits (ASICs), field programmable logic arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry.

When implemented in hardware, the circuit components described in this disclosure may be implemented as one or more discrete components, as one or more integrated devices, or any combination thereof. The circuit components described herein may be fabricated using any of a wide variety of process technologies including Complementary Metal-Oxide-Semiconductor (CMOS) process technologies.

When implemented in software, the functionality ascribed to the systems and devices described in this disclosure may be embodied as instructions on a computer-readable medium such as random access memory (RAM), read-only memory (ROM), non-volatile random access memory (NVRAM), electrically erasable programmable read-only memory (EEPROM), FLASH memory, magnetic media, optical media, or the like. The instructions may be executed to cause a processor to perform or support one or more aspects of the functionality described in this disclosure.

Various aspects and examples have been described. However, modifications can be made to the structure or techniques of this disclosure without departing from the scope of the following claims.

The invention claimed is:

1. A method comprising:
   generating a reference voltage based on a configurable function that defines the reference voltage as a function of two or more main terminal voltages that are obtained at two or more different locations on a metallization that forms a main terminal of a current sensing power metal-oxide-semiconductor field-effect transistor (MOSFET); and
   regulating a sensing terminal of the current sensing power MOSFET at a voltage that is determined based on the reference voltage.

2. The method of claim 1, wherein the configurable function comprises an adjustable voltage divider function.

3. The method of claim 1, wherein the configurable function defines the reference voltage such that the reference voltage is equal to a configurable value that is between two of the two or more main terminal voltages.

4. The method of claim 1, wherein generating the reference voltage comprises generating the reference voltage with a potentiometer that implements the configurable function.

5. The method of claim 4,
   wherein the two or more locations on the metallization comprise a first location on the metallization and a second location on the metallization,
   wherein a first end terminal of the potentiometer is electrically coupled to the first location on the metallization,
   wherein a second end terminal of the potentiometer is electrically coupled to the second location on the metallization, and
   wherein the reference voltage is produced at a wiper terminal of the potentiometer, the wiper terminal being electrically coupled to an adjustable wiper of the potentiometer.

6. The method of claim 1, wherein regulating the sensing terminal based on the reference voltage comprises:
regulating the sensing terminal with an operational amplifier-based control loop that is controlled based on the reference voltage.

7. The method of claim 6,
wherein the operational amplifier-based control loop comprises an operational amplifier,
wherein a non-inverting input of the operational amplifier is electrically coupled to the reference voltage,
wherein a feedback loop is formed between an output of the operational amplifier and an inverting input of the operational amplifier, and
wherein the inverting input of the operational amplifier is electrically coupled to the sensing terminal of the current sensing power MOSFET.

8. The method of claim 1, wherein the configurable function is configured such that a ratio of a main current path current to a sensing current path current is approximately equal to a ratio of a main current path transistor width-to-length ratio to a sensing current path transistor width-to-length ratio.

9. The method of claim 1, wherein the sensing terminal is a sensing source terminal, and the main terminal is a main source terminal.

10. The method of claim 1, wherein the sensing terminal is a sensing drain terminal, and the main terminal is a main drain terminal.

11. A device comprising circuitry configured to:
generate a reference voltage based on a configurable function that defines the reference voltage as a function of two or more main terminal voltages that are obtained at two or more different locations on a metallization that forms a main terminal of a current sensing power metal-oxide-semiconductor field-effect transistor (MOSFET); and
regulate a sensing terminal of the current sensing power MOSFET at a voltage that is determined based on the reference voltage.

12. The device of claim 11, wherein the configurable function comprises an adjustable voltage divider function.

13. The device of claim 11, wherein the configurable function defines the reference voltage such that the reference voltage is equal to a configurable value that is between two of the two or more main terminal voltages.

14. The device of claim 11, wherein the circuitry comprises a potentiometer that implements the configurable function and that is configured to generate the reference voltage based on the configurable function.

15. The device of claim 14,
wherein the two or more locations on the metallization comprise a first location on the metallization and a second location on the metallization,
wherein a first end terminal of the potentiometer is electrically coupled to the first location on the metallization,
wherein a second end terminal of the potentiometer is electrically coupled to the second location on the metallization, and
wherein the reference voltage is produced at a wiper terminal of the potentiometer, the wiper terminal being electrically coupled to an adjustable wiper of the potentiometer.

16. The device of claim 11, wherein the circuitry comprises an operational amplifier-based control loop that is controlled based on the reference voltage and that is configured to regulate the sensing terminal of the current sensing power MOSFET.

17. The device of claim 11, wherein the configurable function is configured such that a ratio of a main current path current to a sensing current path current is approximately equal to a ratio of a main current path transistor width-to-length ratio to a sensing current path transistor width-to-length ratio.

18. The device of claim 11, wherein the sensing terminal is a sensing source terminal, and the main terminal is a main source terminal.

19. The device of claim 11, wherein the sensing terminal is a sensing drain terminal, and the main terminal is a main drain terminal.

20. An apparatus comprising:
means for generating a reference voltage based on a configurable function that defines the reference voltage as a function of two or more main terminal voltages that are obtained at two or more different locations on a metallization that forms a main terminal of a current sensing power metal-oxide-semiconductor field-effect transistor (MOSFET); and
means for regulating a sensing terminal of the current sensing power MOSFET at a voltage that is determined based on the reference voltage.

* * * * *